(12) United States Patent
Funakawa et al.

US006842464B2

(10) Patent No.: US 6,842,464 B2
(45) Date of Patent: Jan. 11, 2005

(54) WAVELENGTH TUNABLE LIGHT SOURCE EQUIPMENT

(75) Inventors: Seiji Funakawa, Yokohama (JP); Toshiyuki Yagi, Yokohama (JP)

(73) Assignee: Acterna R&D Japan, Inc., Yokohama (JP)

( * ) Notice: Subject to any disclaimer, the term of this patent is extended or adjusted under 35 U.S.C. 154(b) by 0 days.

(21) Appl. No.: 10/166,697

(22) Filed: Jun. 12, 2002

(65) Prior Publication Data

US 2003/0147431 A1 Aug. 7, 2003

(30) Foreign Application Priority Data

Feb. 6, 2002 (JP) .................................. 2002-029945

(51) Int. Cl.[7] .............................. H01S 3/10; H01S 3/13
(52) U.S. Cl. ..................................... 372/20; 372/29.02
(58) Field of Search ............................ 372/20, 29.02, 372/99, 102

(56) References Cited

U.S. PATENT DOCUMENTS

| | | | | |
|---|---|---|---|---|
| 4,975,635 A | * | 12/1990 | Takahashi et al. | 324/96 |
| 5,048,926 A | * | 9/1991 | Tanimoto | 359/487 |
| 5,323,373 A | * | 6/1994 | Horimai | 369/110.01 |
| 5,491,714 A | * | 2/1996 | Kitamura | 372/92 |
| 5,625,403 A | * | 4/1997 | Hazman | 347/239 |
| 5,754,571 A | * | 5/1998 | Endoh et al. | 372/20 |
| 5,862,162 A | * | 1/1999 | Maeda | 372/20 |
| 5,970,076 A | * | 10/1999 | Hamada | 372/20 |
| 6,026,100 A | * | 2/2000 | Maeda | 372/20 |
| 6,041,071 A | * | 3/2000 | Tayebati | 372/64 |
| 6,144,678 A | * | 11/2000 | Hamada | 372/20 |
| 6,359,852 B1 | * | 3/2002 | Ueyanagi | 369/118 |
| 6,407,869 B1 | * | 6/2002 | Asami | 359/641 |
| 2001/0005387 A1 | * | 6/2001 | Yamada et al. | 372/20 |
| 2001/0026568 A1 | * | 10/2001 | Asami | 372/43 |
| 2001/0026574 A1 | * | 10/2001 | Yagi | 372/102 |

* cited by examiner

*Primary Examiner*—Minsun Oh Harvey
*Assistant Examiner*—Phillip Nguyen
(74) *Attorney, Agent, or Firm*—Oliff & Berridge, PLC

(57) ABSTRACT

A wavelength tunable light source equipment provided with an external resonator light source having a wavelength selection structure inside it and lasing by a wavelength selected by this and a light path changer introducing at least part of the light emitted from the external resonator light source and including a spontaneous emitted light ingredient to the wavelength selection structure so that a wavelength of the light emitted from the external resonator light source and a wavelength selected by the wavelength selection structure become synchronized. Of the light emitted from the external resonator light source, the light introduced to the wavelength selection structure through the light path changer and emitted from it is made the output light. Due to this configuration, it is possible to reduce the resonator loss of the external resonator light source to stabilize the oscillation in the laser resonator, increase the intensity of the output light with the suppressed spontaneous emitted light ingredient, and finely adjust and freely change the relationship between the intensity of the output light including the spontaneous emitted light ingredient and the intensity of the output light with the suppressed spontaneous emitted light ingredient.

22 Claims, 24 Drawing Sheets

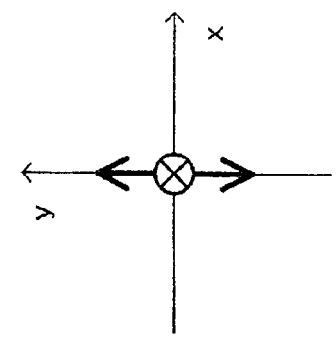
FIG. 8A POLARIZATION STATE S1
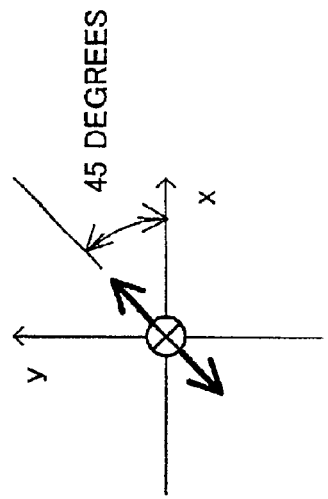
FIG. 8B POLARIZATION STATE S2
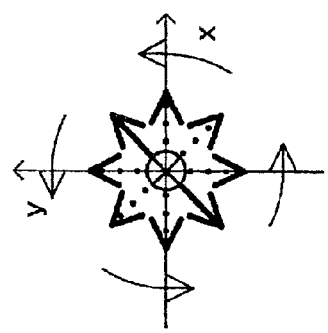
FIG. 8C POLARIZATION STATE S3
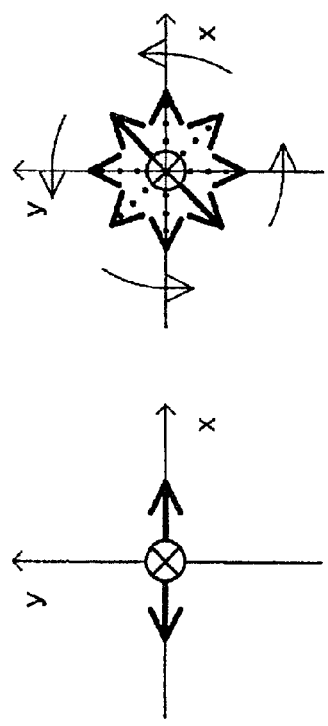
FIG. 8D POLARIZATION STATE S4
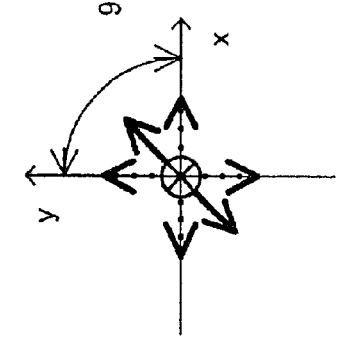
FIG. 8E POLARIZATION STATE S5
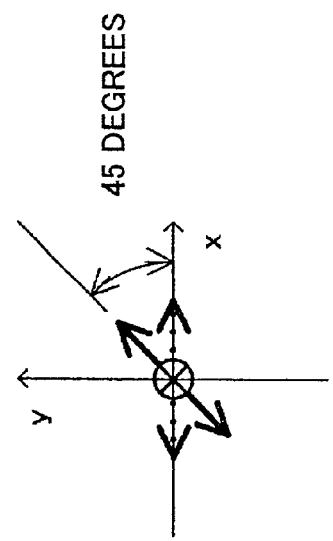
FIG. 8F POLARIZATION STATE S6
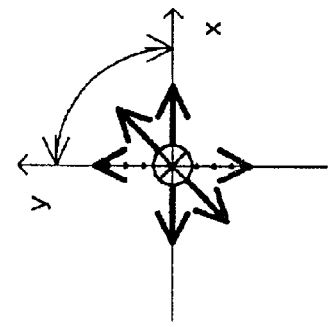
FIG. 8G POLARIZATION STATE S7

FIG. 20
AMPLIFICATION AND SPECTRAL CHARACTERISTICS
OF LASER LIGHT BY OPTICAL AMPLIFIER
(a) BEFORE INPUT TO OPTICAL AMPLIFIER
(OUTPUT OF EXTERNAL RESONATOR
LIGHT SOURCE AND OUTPUT OF
OPTICAL FIBER)
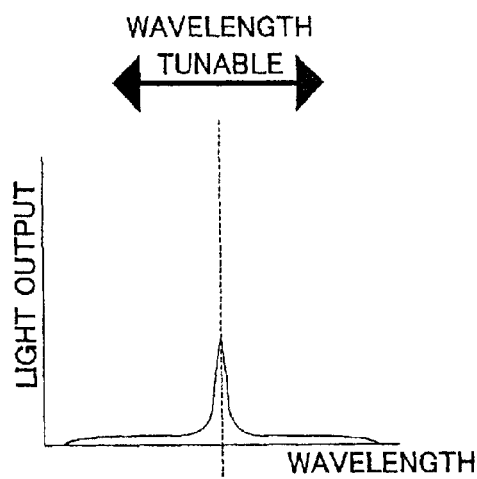
(b) AFTER OUTPUT FROM OPTICAL FIBER
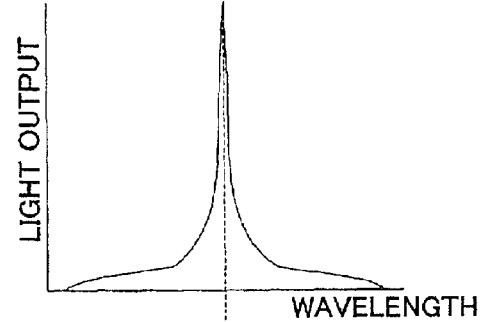
(c) AFTER SELECTION OF WAVELENGTH
(OUTPUT OF WAVELENGTH TUNABLE
LIGHT SOURCE EQUIPMENT)
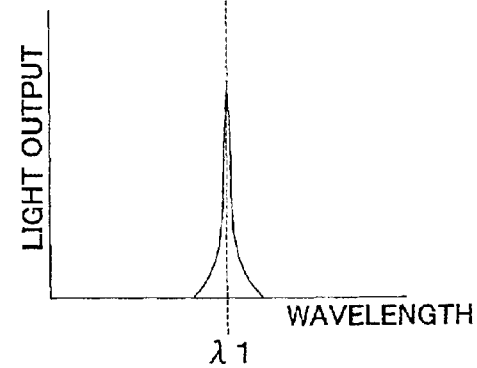

PRIOR ART

WAVELENGTH TUNABLE LIGHT SOURCE EQUIPMENT

BACKGROUND OF THE INVENTION

1. Field of the Invention

The present invention relates to a wavelength tunable light source equipment, more particularly relates to a wavelength tunable light source equipment which can stabilize laser oscillation and freely adjust an intensity of light output with suppressed spontaneous emitted light ingredient.

2. Description of the Related Art

In a wavelength tunable light source equipment using an external resonator, the outputted laser light has been produced in a gain medium provided in the external resonator, which is for determining gain in laser resonance. The light outputted from the wavelength tunable light source equipment includes laser light of the desired wavelength and, also, spontaneous emitted light generated from the gain medium. Therefore, in the conventional wavelength tunable light source equipment, in order to output the laser light with the suppressed spontaneous emitted light, generally a wavelength selection structure and beam splitter have been arranged in the external resonator. In this conventional equipment, reflection light (or diffraction light) from the wavelength selection structure has been obtained by the beam splitter as the output light.

An example of the conventional wavelength tunable light source equipment suppressing the spontaneous emitted light will be explained next referring to FIG. 23. In a wavelength tunable light source equipment 201, a semiconductor laser diode (LD) 202 is used as the light source. The semiconductor laser diode 202 has two end faces 203 and 204. These end faces 203 and 204 are designated as the A-end 203 and the B-end 204. The A-end 203 has a reflectance of tens of percent and forms one end of a laser resonator included in the external resonator light source 205. The B-end 204 is coated with an anti-reflection film (AR film) 206. The B-end 204 has the structure for causing light not to be reflected.

The light emitted from the B-end 204 of the semiconductor laser diode 202 is converted into parallel light by a lens 207, passes through a non-polarization beam splitter (BS) 208, and enters a diffraction grating 209 of a wavelength selection structure 221. In FIG. 23, a plate-shaped diffraction grating 209 is viewed from the side. In the wavelength selection structure 221, the diffraction grating 209 is attached so as to be able to rotate about a rotary shaft 210 by a rotation drive (not shown). The diffraction grating 209 diffracts the light converted to parallel light by the lens 207. Due to the action of the diffraction grating 209, only light of the desired wavelength is emitted at the same angle as the angle of incidence to the diffraction grating 209 and is introduced again to the B-end 204 of the semiconductor laser diode 202 through the lens 207. The diffraction grating 209 functions as one end of a laser resonator in the external resonator light source 205 together with the above A-end 203.

The non-polarization beam splitter 208 is arranged as explained above in the light path between the semiconductor laser diode 202 and the diffraction grating 209. The non-polarization beam splitter 208 splits a part of the light introduced again to the semiconductor laser diode 202 from the diffraction grating 209. The lens 211 focuses the light split by the non-polarization beam splitter 208 and introduces it to an optical fiber 212. This optical fiber 212 forms a light output unit of the wavelength tunable light source equipment 201. A first light output A of the wavelength tunable light source equipment 201 is taken out from the optical fiber 212.

Here, the light output of the wavelength tunable light source equipment 201 will be explained.

The light L2 advancing from the semiconductor laser diode 202 to the diffraction grating 209 includes a spontaneous emitted light ingredient emitted from the semiconductor laser diode 202 in addition to the laser light of the desired wavelength $\lambda 1$. On the other hand, the light L1 taken out from the diffraction grating 209 through the non-polarization beam splitter 208 to the side of optical fiber 212 is only the laser light of the desired wavelength $\lambda 1$ in which the spontaneous emitted light ingredient is suppressed by the wavelength dispersion action of the diffraction grating 209. Therefore, the diffraction grating 209 functions as a wavelength selection structure 203. The spectral distribution of the light L1 is shown as the light output A as indicated by the reference F2 in FIG. 23. Further, the spectral distribution of the light L2 is shown as the light output B as indicated by the reference F1 in FIG. 23.

The above light L1 is outputted as the first light output A from the optical fiber 212. The output of the optical fiber 212 becomes the first light output of only the laser light of the desired wavelength $\lambda 1$ with the suppressed spontaneous emitted light by the wavelength dispersion action of the diffraction grating 209. The light L1 suppressed for the spontaneous emitted light by the wavelength dispersion action of the diffraction grating 209 as mentioned above becomes the first output light of the wavelength tunable light source equipment 201. In this sense, the diffraction grating 209 forms the wavelength selection mechanism 221.

Further, the light including the spontaneous emitted light ingredient emitted from the A-end 203 of the semiconductor laser diode 202 is the same as the above light L2 with regard to the wavelength ingredient. The light emitted from the A-end 203 is converted to parallel light by the lens 213 and focused at the optical fiber 216 by the lens 215 through an isolator 214. The output from the optical fiber 216 becomes the second light output of the wavelength tunable light source equipment 201. The second light output is the above light output B. The light output from the optical fiber 216 is the light L2 and becomes the second output light of the wavelength tunable light source equipment 201.

Note that the isolator 214 is provided so as to prevent the laser oscillation of the external resonator light source 205 from becoming unstable due to light from the outside striking the external resonator light source 205 formed by the A-end 203 and the diffraction grating 209. Further, though not shown in FIG. 23, an isolator may be similarly arranged between the non-polarization beam splitter 208 and the lens 211 at the side of the first light output A with the suppressed spontaneous emitted light ingredient. The isolator makes it possible to suppress effects from the outside on the laser oscillation of the external resonator light source 205.

In FIG. 23, only the diffraction grating 209 for the laser oscillation by the external resonator light source 205 at the desired wavelength is shown. As opposed to this, the conventional external resonator light source shown in FIG. 24 is configured with the semiconductor laser diode 202, non-polarization beam splitter 208, diffraction grating 209, mirror 217, arm 218, and rotary shaft 219 arranged in the predetermined positional relationship illustrated and with the mirror 217 attached to the arm 218 rotating around the rotary shaft 219. This configuration is that of an external resonator light source of a Littmann layout. According to this configuration, it is possible to continuously set the resonance wavelength of the external resonator light source without mode hops and possible to obtain light with the suppressed spontaneous emitted light ingredient such as shown by the first light output A (light L1) by the non-polarization beam splitter 208. As explained above, the diffraction grating 209 is provided to become in a predetermined positional relationship with the rotary shaft 219. By rotating the rotary shaft 219, the arm 218 is moved as shown by the arrow 220 to change the angle formed by the arm 218 and the diffraction grating 209 and to change the position of the mirror 217 fixed to the arm. By this, it is possible to change the resonance wavelength of the external resonator light source.

Note that the laser light forming the light output B is emitted from the A-end 203 of the semiconductor laser diode 202. Further, the diffraction grating 209 produces the 0-th order light output C of the diffraction grating in addition to the light outputs A and B.

According to the configuration of the conventional wavelength tunable light source equipment explained above, light L1 with the suppressed spontaneous emitted light ingredient of the semiconductor laser diode 202 was taken out by providing a beam splitter, that is, the non-polarization beam splitter 208, inside the laser resonator of the external resonator light source 205. Therefore, there was the problem that the resonator loss of the external resonator light source 205 easily increased and became a factor destabilizing the laser oscillation or resonance.

Further, when taking out a lot of light output contributing to the laser oscillation from the laser resonator of the external resonator light source 205, the optical density in the external resonator light source 205 falls, the laser oscillation becomes unstable, and the laser oscillation itself ends up stopping. Therefore, it is difficult to obtain a large light output of light with the suppressed spontaneous emitted light ingredient of the semiconductor laser diode 202.

Further, according to the conventional wavelength tunable light source equipment 201, since the non-polarization beam splitter 208 is provided in the laser resonator of the external resonator light source 205, the relationship of intensity between the light L2 including the spontaneous emitted light ingredient from the semiconductor laser diode 202 and the light L1 including the suppressed spontaneous emitted light ingredient of the semiconductor laser diode 202 taken out from the non-polarization beam splitter 208 is largely governed by the laser oscillation conditions of the external resonator light source 205. The relationship of intensity of the light L1 and light L2 can be adjusted to some extent by adjusting the splitting ratio of the non-polarization beam splitter 208 and the reflectance of the A-end 203 of the semiconductor laser diode 202, but it is not possible to adjust it finely.

Normally, the output intensity of the light L1 with the suppressed spontaneous emitted light ingredient of the semiconductor laser diode 202 is a fraction or one order or more less than the output intensity of the light L2 including the spontaneous emitted light ingredient of the semiconductor laser diode 202. Therefore, it is difficult to make the intensity of the light L1 with the suppressed spontaneous emitted light ingredient of the semiconductor laser diode 202 larger than the output intensity of the light L2 including the spontaneous emitted light ingredient from the semiconductor laser diode 202.

SUMMARY OF THE INVENTION

An object of the present invention is to provide a wavelength tunable light source equipment which can reduce resonator loss of an external resonator light source to stabilize laser oscillation in a laser, increase the intensity of output light with the suppressed spontaneous emitted light ingredient, and finely adjust and freely change the relationship between the intensity of output light including the spontaneous emitted light ingredient and the intensity of the output light with the suppressed spontaneous emitted light ingredient.

The wavelength tunable light source equipment according to the present invention is configured as follows to achieve this object.

The wavelength tunable light source equipment according to the present invention is provided with an external resonator light source having a wavelength selection structure inside it and resonating by a wavelength selected by this and a light path changer introducing at least part of the light emitted from the external resonator light source and including a spontaneous emitted light ingredient to the wavelength selection structure so that a wavelength of the light emitted from the external resonator light source and a wavelength selected by the wavelength selection structure become synchronized. In the above configuration, of the light emitted from the external resonator light source, the light introduced to the wavelength selection structure through the light path changer and emitted from it is made the output light.

In the above configuration, the wavelength selection structure is used to select the wavelength and thereby suppress the spontaneous emitted light ingredient which had been included in light of the external resonator light source and take out only laser light of the desired wavelength as the output light of the wavelength tunable light source equipment. At this time, the wavelength selection structure for determining the resonance wavelength of the external resonator light source and the wavelength selection structure for suppressing the spontaneous emitted light ingredient from the output light of the external resonator light source are the same, so even if the output wavelength of the external resonator light source changes, the wavelength is always synchronized with.

In the above wavelength tunable light source equipment, preferably the wavelength selection structure is a diffraction grating, a structure of a combination of a diffraction grating and one of a mirror and other diffraction grating, or a tunable wavelength filter.

In the above wavelength tunable light source equipment, the light path changer is provided with a non-polarization beam splitter for introducing at least part of the light emitted from the external resonator light source to the wavelength selection structure.

The above wavelength tunable light source equipment is preferably further provided with a polarization beam splitter and $\lambda/4$ plate inside the light path changer when the light emitted from the external resonator light source is linearly polarized light with a fixed direction of polarization and makes the light emitted from the external resonator light source pass through the polarization beam splitter and the $\lambda/4$ plate in that order, then enter the wavelength selection structure and make the light emitted from the wavelength selection structure pass through the $\lambda/4$ plate and the polarization type beam splitter in that order and take it out as the output light. In the above configuration, a Faraday rotator may be used instead of the $\lambda/4$ plate.

In a wavelength tunable light source equipment having a non-polarization beam splitter, preferably the non-polarization beam splitter is set in splitting ratio, produces light output based on the light emitted from the external resonator light source and light output based on light emitted from the wavelength selection structure based on that splitting ratio, and is set so that the ratio of light intensity of the two light outputs becomes a predetermined value.

Similarly, in a wavelength tunable light source equipment having a polarization beam splitter, preferably the polarization beam splitter is set in splitting ratio, produces light output based on the light emitted from the external resonator light source and light output based on light emitted from the wavelength selection structure based on that splitting ratio, and is set so that the ratio of light intensity of the two light outputs becomes a predetermined value. In this configuration, when the splitting ratio of the polarization beam splitter changes due to the polarization state of the light entering the polarization beam splitter or linearly polarized light enters the polarization beam splitter, the splitting ratio of the light changes depending on the relative angle of the linearly polarized light entering the beam splitter. Therefore, the splitting ratio is set by adjusting the relative angle between the linearly polarized light output from the external resonator light source and the polarization beam splitter.

In the above wavelength tunable light source equipment, preferably the light path changer is provided with a light path switching means for creating a light path for introducing light emitted from the external resonator light source to the wavelength selection structure and taking out light emitted from the wavelength selection structure as first output light and a light path for taking out light emitted from the external resonator light source as second output light without passing it through the wavelength selection structure.

In the above configuration, the light path switching means is preferably a mechanism for making the mirror move or rotate, a mechanism for making the polarization beam splitter move or rotate, a mechanism for changing the polarization state of the light, or a mechanism for changing the connection of an optical wave-guide. Further, this optical wave-guide is an optical fiber, optical fiber coupler, or optical circulator.

In the above wavelength tunable light source equipment, preferably an optical amplifier is provided in the light path at a downstream side of an emitting part of the external resonator light source and amplifies the light emitted from the external resonator light source by this optical amplifier.

In the above configuration, the optical amplifier is preferably a semiconductor laser amplifier or optical fiber amplifier. Further, in the above configuration, it is possible to detect part of the output light by a photometer and photodetector and adjust the optical amplification rate of the optical amplifier in accordance with the detection signal to keep the light output constant or to detect part of the output light by a photometer and photodetector and adjust the polarization angle of the Faraday rotator in accordance with the detection signal to keep the light output constant.

According to the above configuration, by using a polarization beam splitter (PBS) and λ/4 plate, the splitting loss inevitably occurring in a non-polarization beam splitter is eliminated, so compared with use of a non-polarization beam splitter, it becomes possible to obtain a larger light output as the light output of the wavelength tunable light source equipment when taking out light with the suppressed spontaneous emitted light ingredient in a semiconductor laser diode included in an external resonator light source.

Similarly, by using a polarization beam splitter and Faraday rotator, the splitting loss of the non-polarization beam splitter is eliminated, so compared with use of a non-polarization beam splitter, it becomes possible to obtain a larger light output as the light output of the wavelength tunable light source equipment when outputting light with the suppressed spontaneous emitted light ingredient of a semiconductor laser diode.

It is possible to emit part of the split light output as light output including the spontaneous emitted light ingredient from the semiconductor laser diode in the same way as the signal output of a conventional wavelength tunable light source. As opposed to this, the other split light output is emitted as light with the suppressed spontaneous emitted light ingredient of the semiconductor laser diode as the light output from the wavelength selection structure. The ratio between the intensity of the light including the spontaneous emitted light from the semiconductor laser diode and the intensity of the light with the suppressed spontaneous emitted light ingredient of the semiconductor laser diode can be adjusted based on the splitting ratio of the beam splitter splitting the output light of the external resonator light source considering the light output loss of the wavelength selection structure or loss on other light paths.

When taking out light output with the suppressed spontaneous emitted light ingredient of the semiconductor laser diode as the light output of the wavelength tunable light source equipment, it is possible to take it out efficiently without the need for using a beam splitter or other optical ingredient causing loss and thereby possible to obtain larger light output containing the suppressed spontaneous emitted light ingredient of the semiconductor laser diode.

Further, by providing a light path switching means at this time, it becomes possible to obtain a larger light output compared with the conventional method of arraying a beam splitter inside an external resonator in both the light outputs of the light output including the spontaneous emitted light from the semiconductor laser diode and the light output including the suppressed spontaneous emitted light ingredient of the semiconductor laser diode without causing a large optical loss.

According to the configuration of inputting light output from the external resonator light source to the optical amplifier, the optical amplifier amplifies the desired output wavelength of the external resonator light source and simultaneously amplifies the spontaneous emitted light noise of the semiconductor laser diode. Further, the spontaneous emitted light noise of the optical amplifier itself is added to the amplified output of the external resonator light source. The output light of the external resonator light source unit includes the spontaneous emitted light noise of the semiconductor laser diode and is amplified by the optical amplifier. The above output light and the spontaneous emitted light noise of the optical amplifier itself are introduced to the wavelength selection structure synchronized with the output wavelength of the external resonator light source. Through the wavelength selection structure, only the light of the desired output wavelength amplified by the optical amplifier is taken out, and the spontaneous emitted light noise of the semiconductor laser diode amplified by the optical amplifier and the spontaneous emitted light noise of the optical amplifier itself added to it are removed. Thereby, large light output with the suppressed spontaneous emitted light noise can be obtained as the light output of the wavelength tunable light source equipment.

It is also possible to configure the apparatus to split the light selected in wavelength by the tunable wavelength filter using the beam splitter, introduce part of the split light to a photodetector, use the signal of the photodetector as an input signal, and adjust the gain of the optical amplifier so that the magnitude of the optical input to the photodetector becomes constant at all times by an automatic power control (APC) circuit. The light output of the wavelength tunable light source equipment amplified by the optical amplifier and suppressed in the spontaneous emitted light noise by the tunable wavelength filter is a stable light output.

It is also possible to configure the apparatus to split the light selected in wavelength by the tunable wavelength filter using the beam splitter, introduce part of the split light to a photodetector, use the signal of the photodetector as an input signal, and adjust the polarization angle of the laser light by a Faraday rotator so that the magnitude of the optical input to the photodetector becomes constant at all times by an automatic power control circuit. By adjusting the polarization angle by a Faraday rotator, the intensity of the light output passing through the polarization beam splitter is adjusted, so the light output of the wavelength tunable light source equipment, which is suppressed in the spontaneous emitted light noise by the tunable wavelength filter, is a stable light output.

BRIEF DESCRIPTION OF THE DRAWINGS

These and other objects and features of the present invention will become clearer from the following description of the preferred embodiments given with reference to the attached drawings, wherein:

FIGS. 8A to 8G are views explaining polarization states;

FIG. 20 is a view showing the amplification and spectral characteristics (a), (b) and (c) of laser light of an optical amplifier;

DESCRIPTION OF THE PREFERRED EMBODIMENTS

Figure 1:
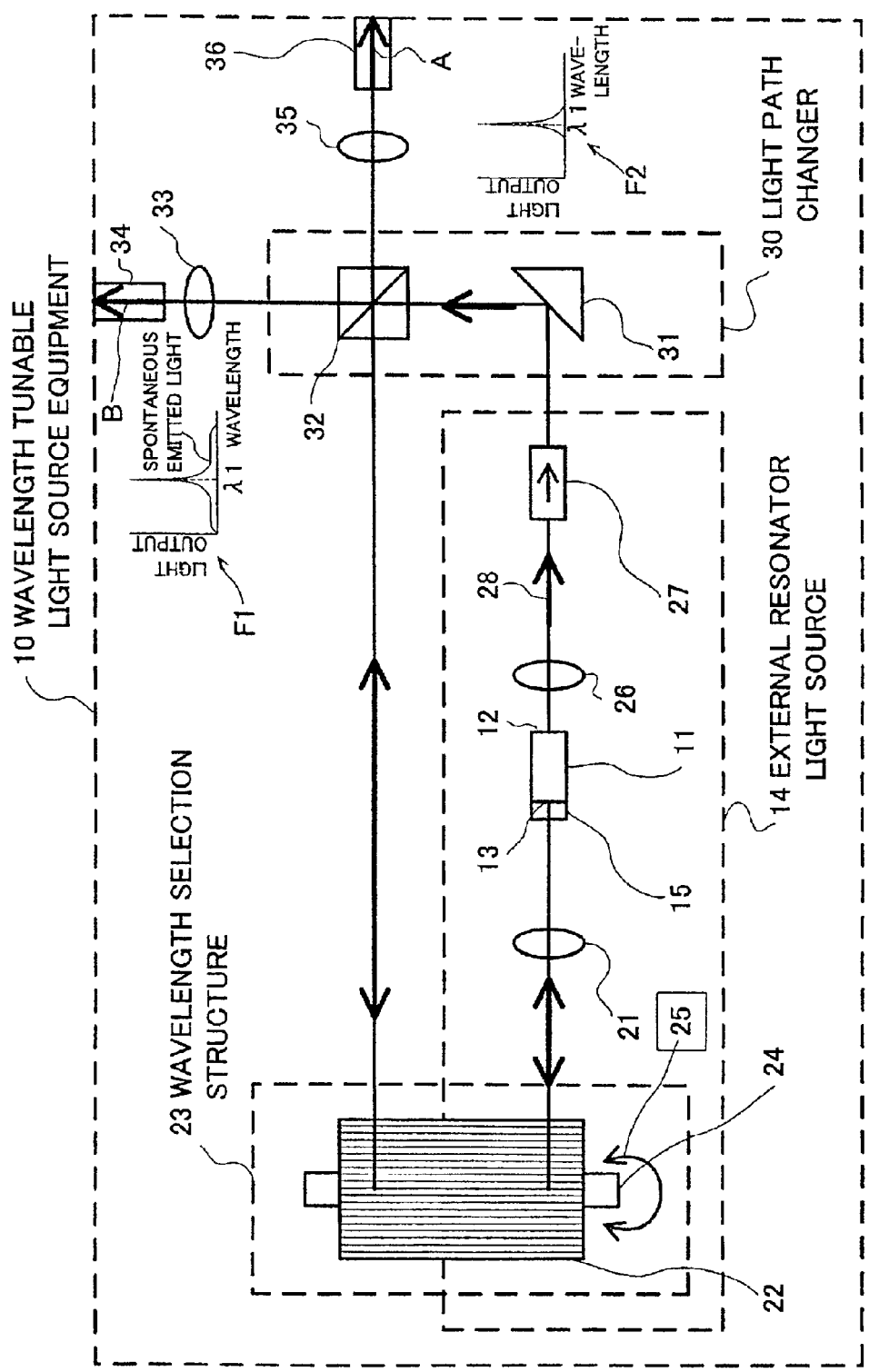
FIG. 1 is a view of the configuration of a wavelength tunable light source equipment according to a first embodiment of the present invention.

Preferred embodiments of the present invention will be described in detail below while referring to the attached figures. First, a first embodiment of a wavelength tunable light source equipment according to the present invention will be explained with reference to FIG. 1. In the wavelength tunable light source equipment 10 shown in FIG. 1, the semiconductor laser diode 11 has a gain in for example the 1550 nm wavelength band and has two end faces formed by cleavage, that is, an A-end 12 and a B-end 13. The A-end 12 has a reflectance of for example about 30% and forms one end of a laser resonator included in an external resonator light source 14. The B-end 13 is coated with an anti-reflection film 15 and is set to have a reflectance of for example not more than about 0.1% with respect to light having a wavelength of the 1550 nm band. The B-end 13 does not reflect light in this structure.

The light emitted from the B-end 13 of the semiconductor laser diode 11 is converted to parallel light by a lens 21, then is introduced to a diffraction grating 22. The diffraction grating 22 acts as a wavelength selection structure 23. In FIG. 1, the diffraction grating 22 is drawn showing the surface where the grooves are formed. The diffraction grating 22 has for example 1000 grooves per mm and diffracts the light converted to parallel light by the lens 21. In FIG. 1, the diffraction grating 22 can rotate as shown by the arrow 25 by a rotary shaft 24 to change the angle of incidence from the lens 21 to the diffraction grating 22. In the diffraction grating 22, light of the desired wavelength λ1 corresponding to that angle is emitted by the same angle as the angle of incidence to the diffraction grating 22, then the emitted light is introduced again to the semiconductor laser diode 11 through the lens 21. The diffraction grating 22, together with the A-end 12, forms one end of the laser resonator in the external resonator light source 14. Due to this, the external resonator light source 14 resonates by the desired wavelength λ1 so as to make a laser oscillation.

The laser light emitted from the A-end 12 of the semiconductor laser diode 11 is converted to parallel light by a lens 26 and emitted from the external resonator light source 14 through an isolator 27. The isolator 27 has isolation characteristics of at least 60 dB with respect to incidence of light of an opposite direction to the arrow 28 shown in FIG. 1, prevents the introduction of light from the outside inside the laser resonator configured by the A-end 12 and diffraction grating 22, and thereby prevents the state of the laser oscillation from becoming unstable.

The laser light output as the output light of the external resonator light source 14 through the isolator 27 is introduced to a light path changer 30. The light path changer 30 is comprised of a mirror 31 and a non-polarization beam splitter 32. The laser light introduced to the light path changer 30 is changed in path by the mirror 31 and is introduced to the non-polarization beam splitter 32. The non-polarization beam splitter 32 has a splitting ratio of preferably 50:50 with respect to the introduced light. Of the laser light introduced to the non-polarization beam splitter 32, due to the splitting ratio of the non-polarization beam splitter 32, 50% passes through it and is introduced to the lens 33, while the remaining 50% is reflected and is introduced to the diffraction grating 22. The portion introduced to the diffraction grating 22 is positioned at the outside of the external resonator light source 14. Further, the laser light passing through the non-polarization beam splitter 32 is introduced to the lens 33, is focused at the optical fiber 34, and is emitted as the second light output of the wavelength tunable light source equipment 10, that is, the light output B. The laser light emitted as the light output B, as being clear from the spectral composition graph F1 shown in FIG. 1, is the light output of the laser light oscillated at the desired wavelength λ1 plus the spontaneous emitted light ingredient emitted from the semiconductor laser diode 11.

The laser light reflected at the non-polarization beam splitter 32 and introduced to the diffraction grating 22 has a spectral composition similar to the above light output B. The angle of incidence of the laser light introduced from the non-polarization beam splitter 32 to the diffraction grating 22 is adjusted to become the same as the angle at which the light emitted from the B-end 13 of the semiconductor laser diode 11 is introduced to the diffraction grating 22 through the lens 21. The angle of incidence is adjusted by adjusting the angle of the mirror 31 and non-polarization beam splitter 32 in the light path changer 30.

As being clear from FIG. 1, the diffraction grating which the light emitted from the B-end 13 of the semiconductor laser diode 11 is introduced to is identical to the diffraction grating which the light emitted from the non-polarization beam splitter 32 is introduced to. That is, it is the diffraction grating 22. Two parts of the diffraction grating 22 are utilized for their diffraction. Therefore, the conditions at the diffraction grating 22 are the same for both laser light emitted from the B-end 13 of the semiconductor laser diode 11 and the laser light emitted from the non-polarization beam splitter 32.

The laser light introduced from the non-polarization beam splitter 32 to the diffraction grating 22 is selected to be of the same wavelength as the resonance wavelength λ1 of the external resonator light source 14, so the laser light diffracted by the diffraction grating 22 again passes through the same path and is introduced to the non-polarization beam splitter 32. 50% of the laser light introduced to the non-polarization beam splitter 32 passes through the non-polarization beam splitter 32, is focused by the lens 35, and is introduced to the optical fiber 36. The laser light introduced to the optical fiber 36 is outputted as the light output A. The light output A becomes light in which the spontaneous emitted light ingredient emitted from the semiconductor laser diode 11 may be suppressed by the wavelength dispersion effect of the diffraction grating 22 as shown clearly from the spectral composition graph F2 shown in FIG. 1. The light output A is emitted from the optical fiber 36 as the first light output of the wavelength tunable light source equipment 10.

According to the first embodiment, the non-polarization beam splitter is not provided in the external resonator light source 14, but is provided on the light path at the downstream side of the isolator 27 of the external resonator light source 14 in the light path changer 30. In the wavelength tunable light source equipment 10 according to the first embodiment, laser light including the spontaneous emitted light ingredient is emitted from the external resonator light source 14. After being emitted from the external resonator light source 14, the non-polarization beam splitter 32 in the light path changer 30 takes out light output B including the spontaneous emitted light ingredient and the output light A with the suppressed spontaneous emitted light ingredient obtained by introduction to the diffraction grating 22 again.

According to the configuration of the first embodiment, since a non-polarization beam splitter is not provided in the external resonator light source 14, there is the advantage that it is possible to reduce the loss of the laser resonator or oscillator and possible to stabilize the resonance or oscillation in the laser resonator. Further, the splitting ratio of the non-polarization beam splitter 32 in the light path changer 30 is preferably made 50:50. By doing this, it is possible to increase the intensity of the light output with the suppressed spontaneous emitted light ingredient. Further, by changing the splitting ratio of the non-polarization beam splitter 32, it is possible to adjust and change the relationship between the intensity of the light output B including the spontaneous emitted light ingredient and the intensity of the light output A with the suppressed spontaneous emitted light ingredient. Note that the splitting ratio at the non-polarization beam splitter 32 is set by adjusting the reflectance of a reflecting film provided between two prisms forming the non-polarization beam splitter 32.

Figure 2:
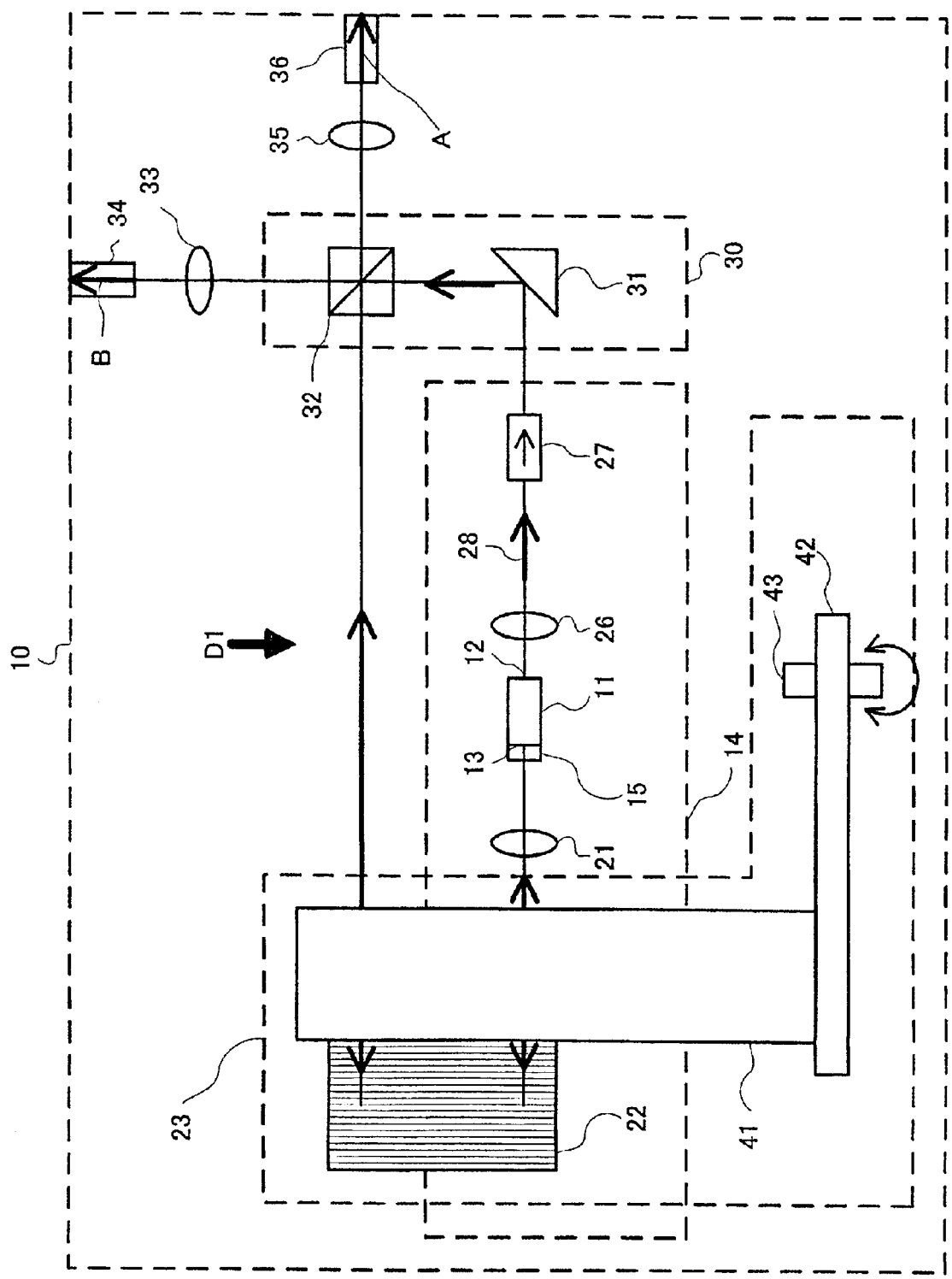
FIG. 2 is a view of the configuration of a wavelength tunable light source equipment according to a second embodiment of the present invention.
Figure 3:
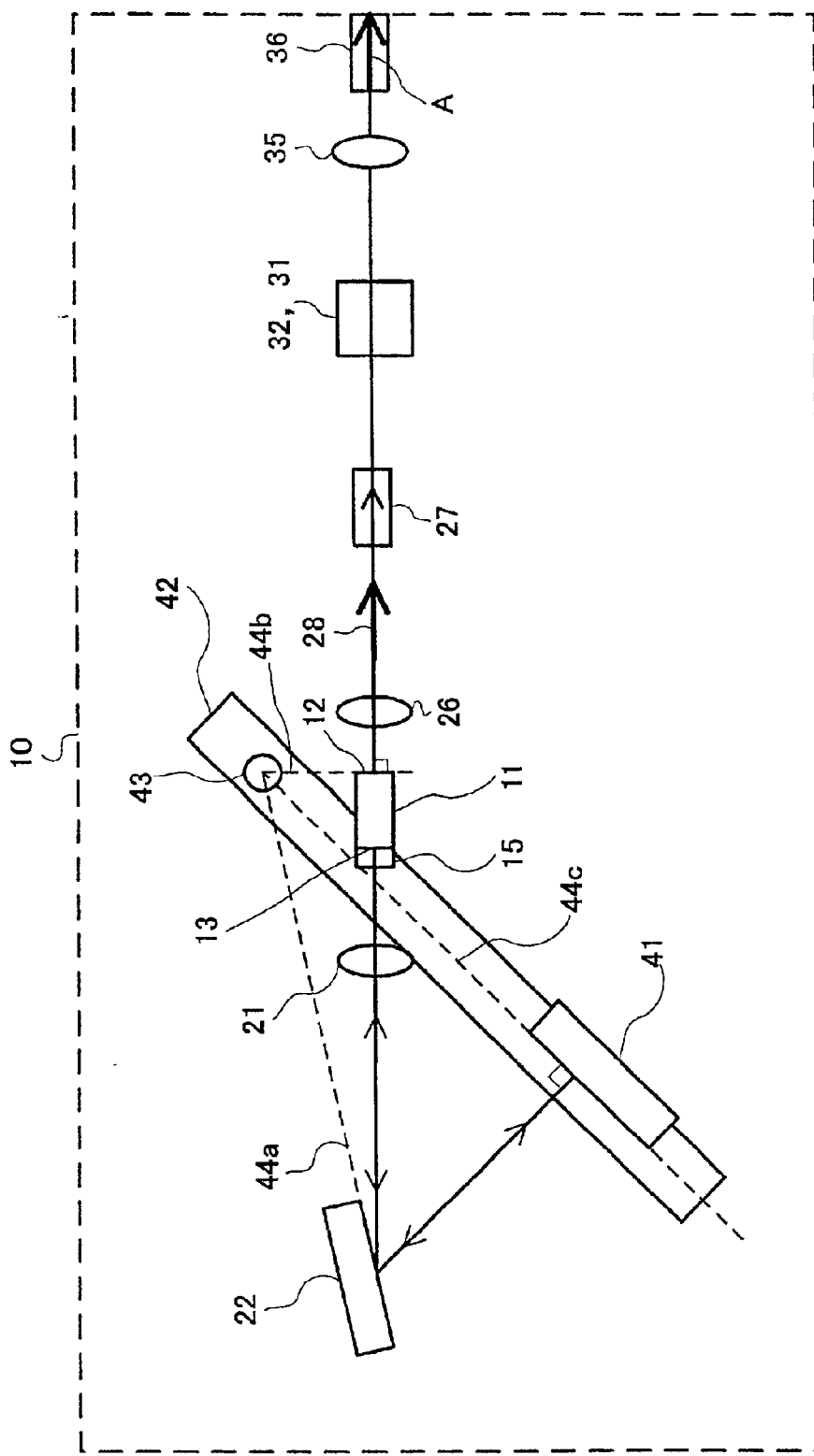
FIG. 3 is a perspective view seen from a direction D1 in FIG. 2.

Next, a second embodiment of the wavelength tunable light source equipment according to the present invention will be explained with reference to FIG. 2 and FIG. 3. FIGS. 2 and 3 show the configuration of the wavelength tunable light source equipment of the second embodiment. FIG. 2 is a side view, while FIG. 3 is a perspective view seen from the direction D1 in FIG. 2. In these figures, elements substantially the same as elements explained in the first embodiment are assigned the same reference numerals.

As shown in FIG. 3, the semiconductor laser diode 11, diffraction grating 22, and mirror 41 are arranged in a Littmann layout. A laser is comprised by the A-end 12 of the semiconductor laser diode 11 and the mirror 41. In this laser resonator, the wavelength of the output light emitted changes depending on the rotation of the mirror 41 attached to the arm 42 around the rotary shaft 43. If the refractive index of the semiconductor laser diode 11 at this time is assumed to be "1", by positioning the A-end 12, diffraction grating 22, and mirror 41 in the positional relationship shown by the broken lines 44a, 44b, and 44c respectively, it is well known that the phases of the laser oscillating wavelength of the external resonator light source 14 and the laser resonator always match and the laser resonance changes continuously without mode hops. The laser light emitted from the external resonator light source 14 passes through the mirror 31 and the non-polarization beam splitter 32, is selected in wavelength by the diffraction grating 22 and mirror 41, is again focused by the lens 35 through the non-polarization beam splitter 32, is introduced to the optical fiber 36, and is emitted as the light output A of the wavelength tunable light source equipment 10.

According to the second embodiment, in addition to the action and effects of the first embodiment, since the light passes through the diffraction grating 22 by the path heading to the diffraction grating 22 compared with the first embodiment, the spontaneous emitted light ingredient emitted from the semiconductor laser diode 11 is suppressed more efficiently. Further, by providing another diffraction grating instead of the mirror 41, it becomes possible to more efficiently suppress the spontaneous emitted light ingredient.

Figure 4:
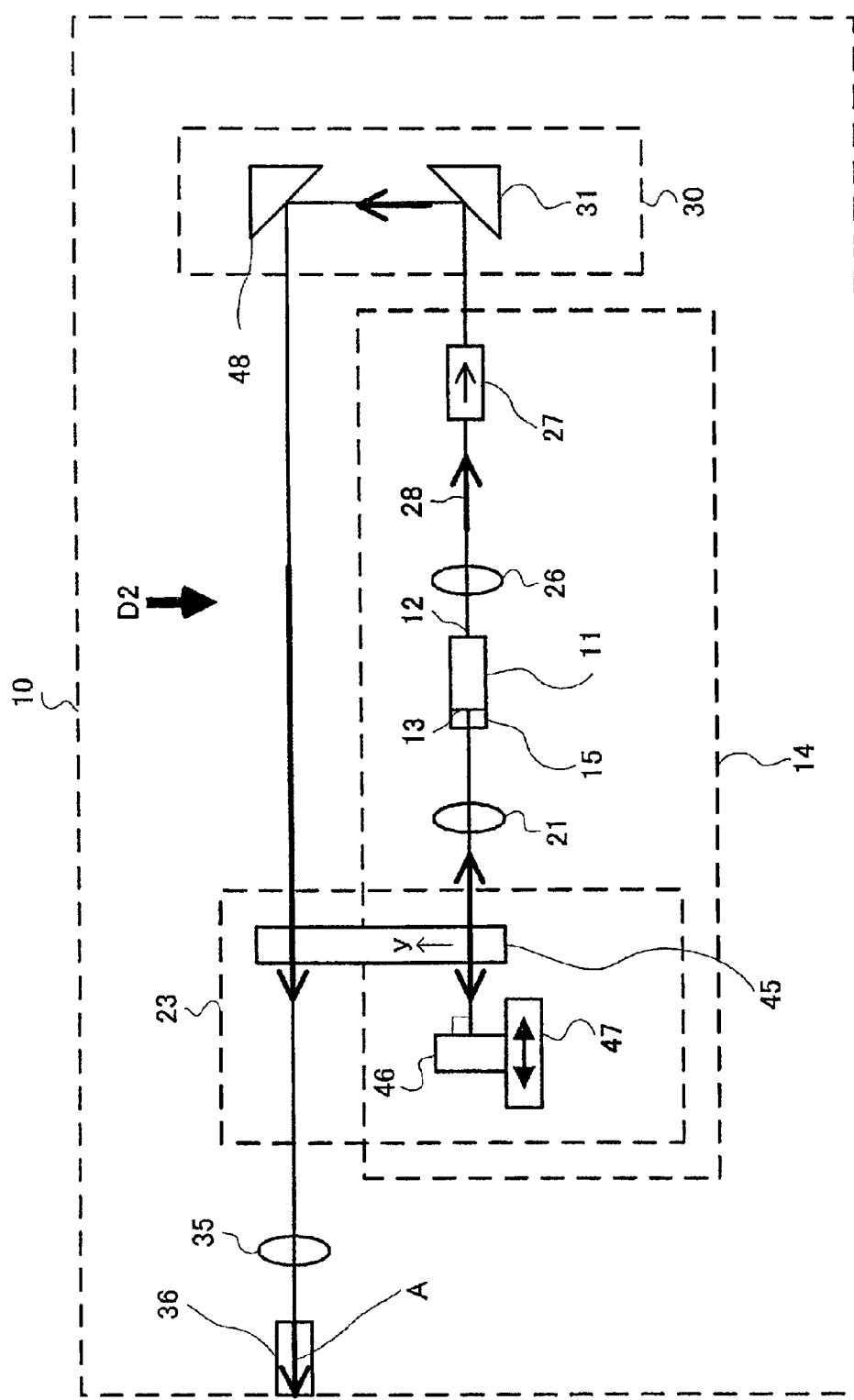
FIG. 4 is a view of the configuration of a wavelength tunable light source equipment according to a third embodiment of the present invention.
Figure 5:
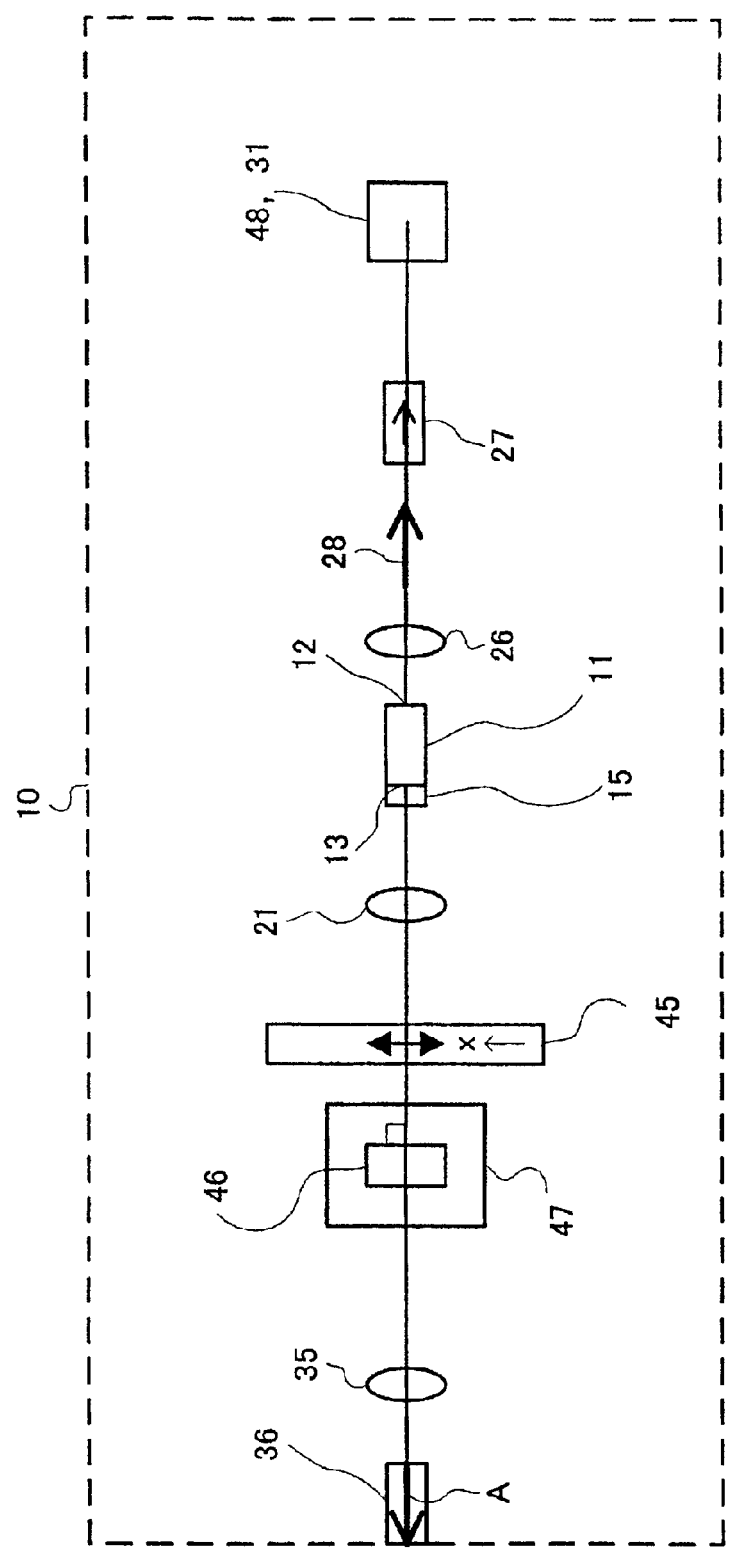
FIG. 5 is a perspective view seen from a direction D2 in FIG. 2.

A third embodiment of the wavelength tunable light source equipment according to the present invention will be explained with reference to FIG. 4 and FIG. 5. FIG. 4 and FIG. 5 show the configuration of a wavelength tunable light source equipment according to the third embodiment. FIG. 4 is a side view while FIG. 5 is a perspective view seen from the direction D2 in FIG. 4. In these figures, elements substantially the same as the elements explained in the first embodiment are assigned the same reference numerals.

In the third embodiment, the semiconductor laser diode 11, A-end 12, B-end 13, anti-reflection film 15, and lens 21 are the same as in the configuration of the first embodiment. The light emitted from the semiconductor laser diode 11 through the B-end 13 is converted to parallel light by the lens 21.

In this embodiment, the wavelength selection structure 23 is comprised of a tunable wavelength filter 45, mirror 46, and movement mechanism 47 for making the mirror 46 move in the left-right direction of FIG. 4. In the tunable wavelength filter 45, the arrow y in FIG. 4 and the arrow x in FIG. 5 show the axial directions of the tunable wavelength filter. The tunable wavelength filter 45 is a narrow band wavelength band-pass filter passing only the desired wavelength. It is a tunable wavelength filter which exhibits the same wavelength passage characteristic in the y-axial direction and changes in wavelength passed in the x-axial direction by a constant rate of change.

The light converted to parallel light by the lens 21 passes through the tunable wavelength filter 45 by just the desired wavelength. The light passing through the tunable wavelength filter 45 perpendicularly strikes the mirror 46, then follows back the path of incidence, is introduced again to the tunable wavelength filter 45, is selected in wavelength by the same wavelength again, then is focused by the lens 21 and is introduced to the semiconductor laser diode 11. In this way, the A-end 12 and mirror 46 form a laser resonator. Laser oscillation is generated in the wavelength selected by the tunable wavelength filter 45. The laser light emitted from the A-end 12 is converted to parallel light by the lens 26 and emitted through the isolator 27.

The mirrors 31 and 48 are arranged so that the laser light emitted from the external resonator light source 14 becomes the same in wavelength passed through the tunable wavelength filter 45 as the oscillation wavelength of the laser light. The light path changer 30 according to this embodiment is comprised of the mirrors 31 and 48. The laser light reflected at the mirror 48, then passing through the tunable wavelength filter 45 is the light A with the suppressed spontaneous emitted light ingredient emitted from the semiconductor laser diode 11. This laser light is focused by the lens 35 and introduced to the optical fiber 36. The above-mentioned light output A is outputted from the optical fiber 36.

According to the configuration of the third embodiment, the mirror 46 forming one end of the laser resonator in the external resonator light source 14 is arranged on the movement mechanism 47 and the resonance wavelength of the laser resonator comprised by the A-end 12 and the mirror 46 is adjusted. Due to this, generally the external resonator light source 14 is configured so as not to suffer from mode hops in laser resonance.

Note that in the configuration of the third embodiment as well, in the same way as the first embodiment etc. explained above, it is possible to use a non-polarization beam splitter 32 instead of the mirror 48 in the light path changer 30. In this case, part of the light output from the external resonator light source 14 is separated by the non-polarization beam splitter 32 and heads to the tunable wavelength filter 45 side. The remaining light passes through the non-polarization beam splitter 32 and heads to another optical fiber 34 as shown in FIG. 1. Therefore, the laser light passing through the tunable wavelength filter 45 is obtained as the light output A, while the light output B including the spontaneous emitted light ingredient is obtained from the optical fiber 34.

Figure 6:
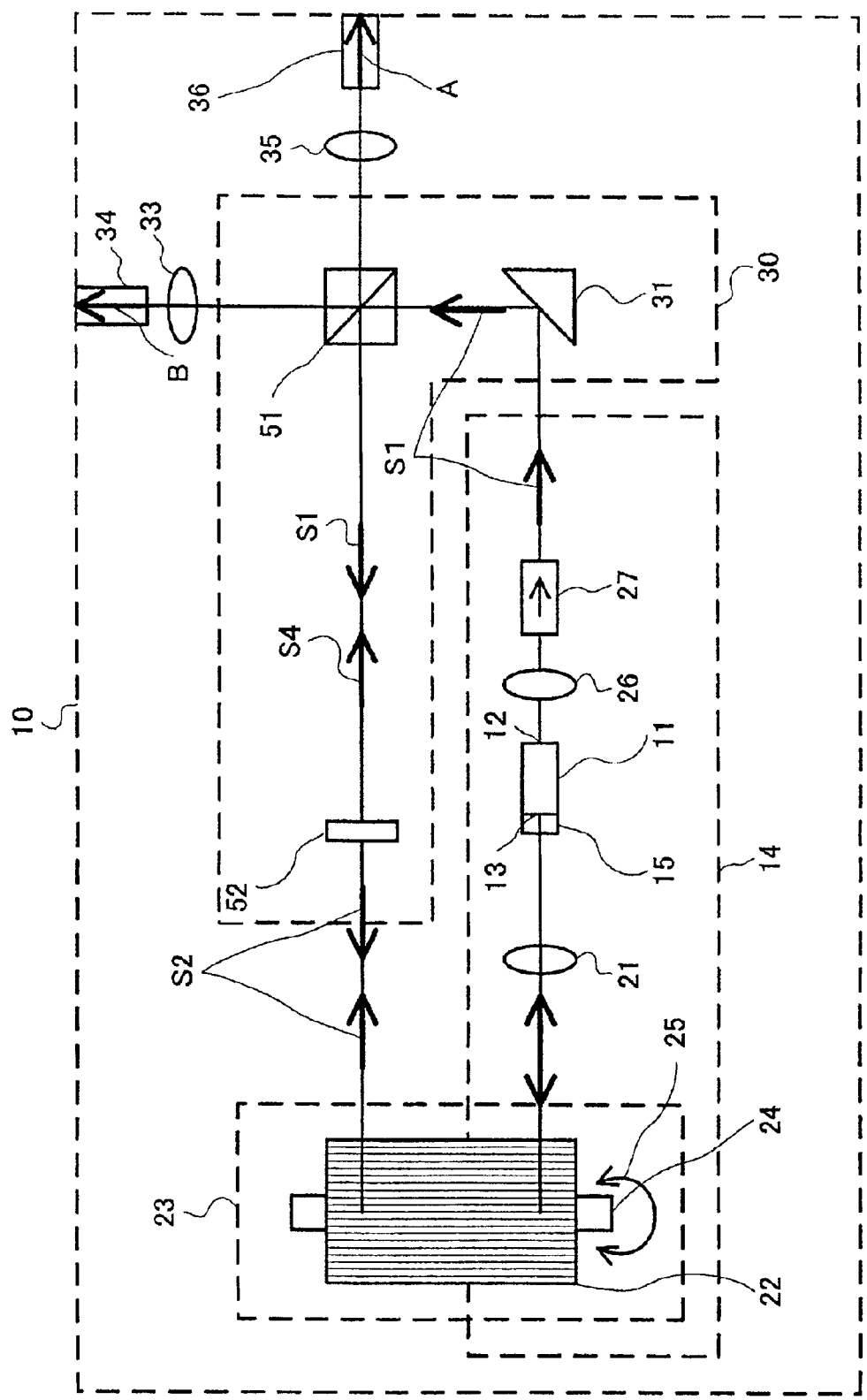
FIG. 6 is a view of the configuration of a wavelength tunable light source equipment according to a fourth embodiment of the present invention.

A fourth embodiment of the wavelength tunable light source equipment according to the present invention will be explained next with reference to FIG. 6. In the fourth embodiment, the ingredients included in the external resonator light source 14 are the same as in the first embodiment. The laser light emitted from the external resonator light source 14 is linearly polarized light. This polarization state is designated as S1.

FIGS. 8A to 8G show details of the polarization states for the direction of advance of the laser light. In FIGS. 8A to 8G, seven polarization states S1 to S7 are shown. Details of the polarization states will become clearer in the following explanation.

In the fourth embodiment, the laser light emitted from the external resonator light source 14 is changed in path by the mirror 31 and is introduced to the polarization beam splitter 51. The polarization beam splitter 51 is placed to reflect light of the polarization state S1. Here, the polarization state S1, as shown in FIG. 8A, is one where the slant of the oscillation plane of the light (polarization plane) is 0 degree and the polarization plane matches with the x-axis in the xy plane showing the polarization state. The part of the laser light reflected by the polarization beam splitter 51 is introduced to the λ/4 plate 52. The laser light introduced to the λ/4 plate 52, as shown by FIG. 8B, changes in slant of the oscillation plane to change to the polarization state S2 rotated counterclockwise. The laser light rotationally polarized as in the polarization state S2 is introduced to the diffraction grating 22 where the spontaneous emitted light ingredient emitted from the semiconductor laser diode 11 is suppressed and only the desired wavelength is selected, then again is introduced to the λ/4 plate 52. The laser light introduced to and passing through the λ/4 plate 52 from the diffraction grating 22 changes in angle of polarization by 90 degrees compared with the polarization state S1 as shown by FIG. 8D. The oscillation plane of the laser light of the polarization state S4 matches with the y-axis in the xy-plane. The laser light of the polarization state S4 is introduced to the polarization beam splitter 51 again. The polarization beam splitter 51 allows the laser light of the polarization state S4 to pass through it and be introduced to the lens 35. The laser light is focused at the lens 35, is introduced to the optical fiber 36, and is emitted as the output light A of the wavelength tunable light source equipment 10.

According to the wavelength tunable light source equipment according to the fourth embodiment, compared with the case of use of the non-polarization beam splitter 32 of the first embodiment, the loss due to the beam splitter can be eliminated. Therefore, it is possible to obtain a larger light output compared with the configuration of the first embodiment. Further, by arranging the polarization beam splitter 51 to obtain the desired ratio of reflection and transmittance with respect to linearly polarized light, it is possible to obtain both light outputs of a light output A with the suppressed spontaneous emitted light ingredient emitted from the semiconductor laser diode 11 and, while not shown in FIG. 6, a light output B including the spontaneous emitted light ingredient emitted from the semiconductor laser diode 11. Note that the polarization beam splitter 51 is also provided with a lens 33 and optical fiber 34 for taking out the light output B. At this time, the ratio between the light output A and the light output B is determined by the splitting ratio (ratio of reflection and transmittance) of the polarization beam splitter 51. The splitting ratio of the beam splitter or the polarization beam splitter 51, changes depending on the polarization state of the light introduced to the polarization beam splitter. Further, when linearly polarized light is introduced to the polarization beam splitter, the splitting ratio of the light changes depending on the relative angle of the linearly polarized light introduced to the beam splitter. The splitting ratio is set by adjusting the relative angle between the linearly polarized light emitted from the external resonator light source 14 and the polarization beam splitter 51.

Figure 7:
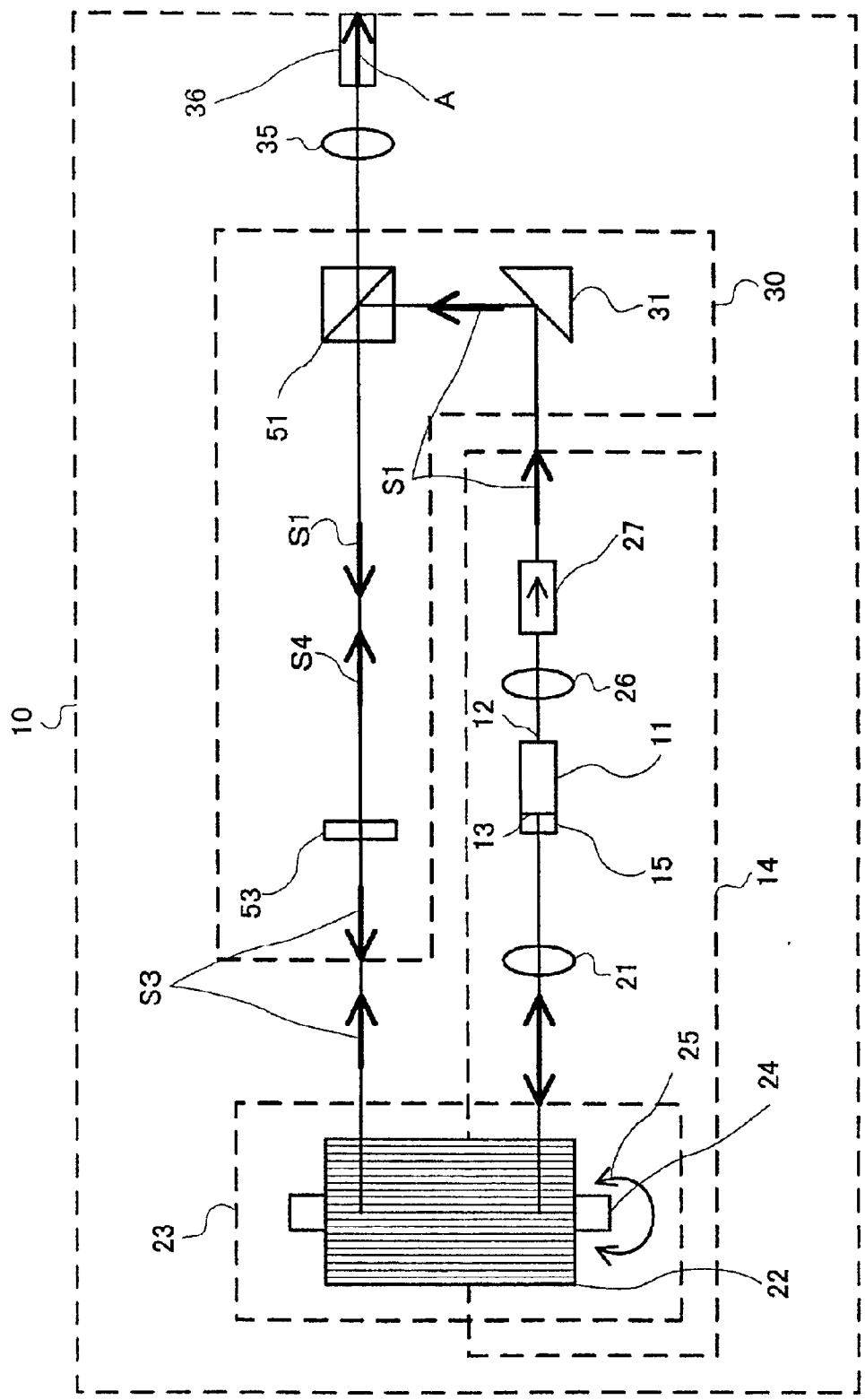
FIG. 7 is a view of the configuration of a wavelength tunable light source equipment according to a fifth embodiment of the present invention.

A fifth embodiment of the wavelength tunable light source equipment according to the present invention will be explained next with reference to FIG. 7. The fifth embodiment is a modification of the fourth embodiment. In the fifth embodiment, instead of the λ/4 plate 52, a Faraday rotator 53 is used. The rest of the configuration is the same as the configuration explained in the fourth embodiment. The same elements are assigned the same reference numerals. The Faraday rotator 53 is adjusted so that the polarization state of the input laser light is rotated 45 degrees counterclockwise. The laser light emitted from the external resonator light source 14 is linearly polarized light. This polarization state is the above polarization state S1. The laser light is changed in path by the mirror 31 and introduced to the polarization beam splitter 51. The part of the laser light reflected by the polarization beam splitter 51 is introduced to the Faraday rotator 53. The laser light introduced to the Faraday rotator 53 becomes the polarization state S3 changed in slant of polarization by 45 degrees counterclockwise from the polarization state S1 as shown by FIG. 8C. The laser light having the polarization state S3 is introduced to the diffraction grating 22 where the spontaneous emitted light ingredient emitted from the semiconductor laser diode 11 is suppressed and only the desired wavelength is selected, then again is introduced to the Faraday rotator 53. The laser light introduced to and passing through the Faraday rotator 53 from the diffraction grating 22 becomes the above polarization state S4 shown in FIG. 8D, then becomes the laser light of the state changed in angle of polarization by 90 degrees from the polarization state S1 and is introduced to the polarization beam splitter 51 again. The polarization beam splitter 51 allows the laser light of the polarization state S4 to pass and be introduced to the lens 35. The laser light is focused by the lens 35, is introduced to the optical fiber 36, and is emitted as the output light A of the wavelength tunable light source equipment 10. The configuration of the fourth embodiment as well is also provided with the lens 33 and optical fiber 34 shown in FIG. 1 at the polarization beam splitter 51, but illustration is omitted.

According to the fifth embodiment, a polarization beam splitter 51 and Faraday rotator 53 are used, so it is possible to reduce the splitting loss and obtain larger light outputs A and B compared with the case of use of a non-polarization beam splitter.

Note that similar effects can of course be obtained even with an element other than a Faraday rotator 53 such as a PLZT if it can cause rotation of the polarization state to a desired angle.

Figure 9:
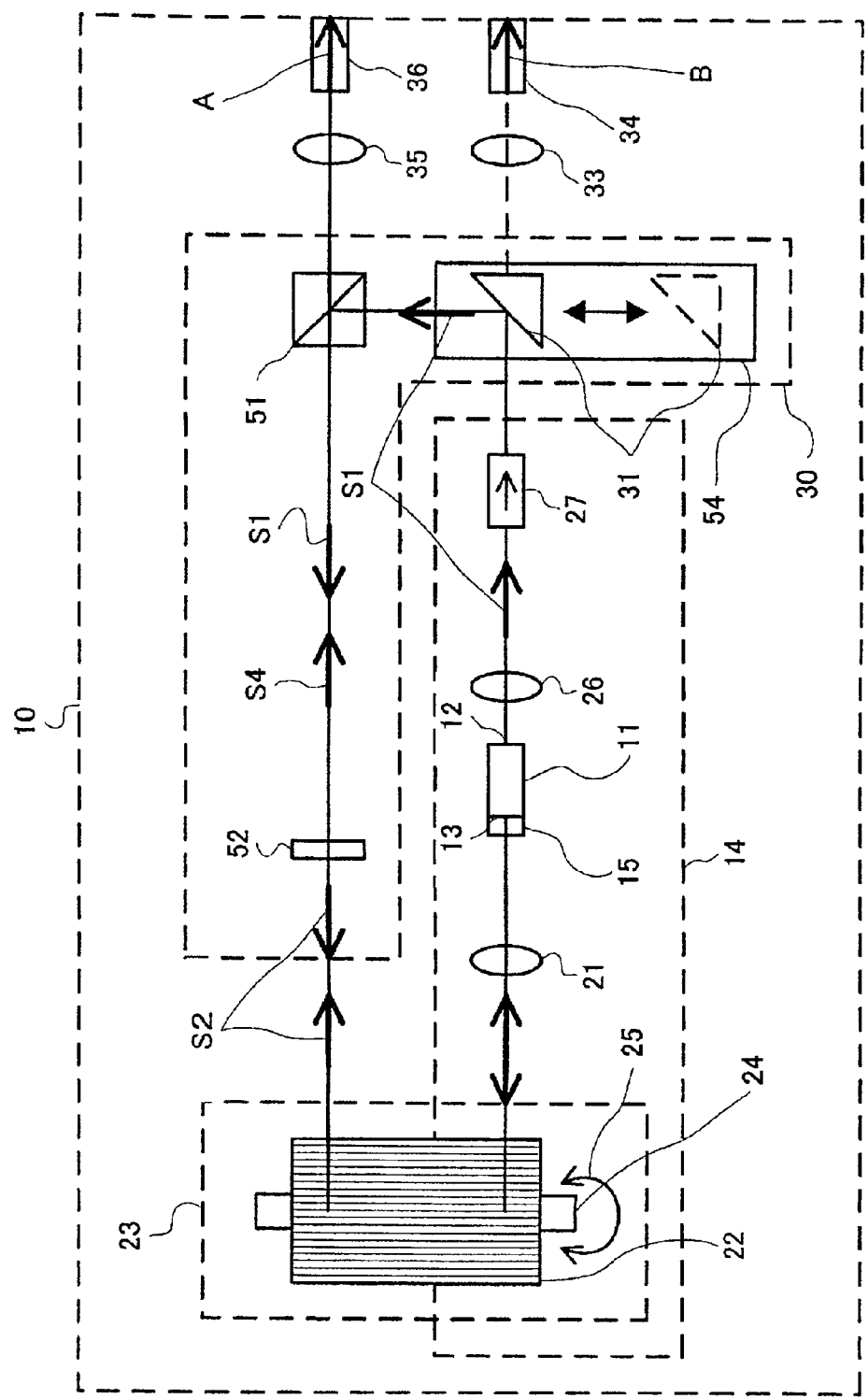
FIG. 9 is a view of the configuration of a wavelength tunable light source equipment according to a sixth embodiment of the present invention.

Next, a sixth embodiment of the wavelength tunable light source equipment according to the present invention will be explained with reference to FIG. 9. FIG. 9 is a view of the configuration of a wavelength tunable light source equipment according to the sixth embodiment. The sixth embodiment is a modification of the fourth embodiment as an example. The wavelength tunable light source equipment according to the sixth embodiment is comprised of the configuration of the fourth embodiment provided with the mirror 31 on a movement mechanism 54 and provided with a lens 33 and optical fiber 34. The lens 33 and optical fiber 34 are the same as those in the configuration for taking out the light output B shown in the first embodiment. The rest of the configuration is the same as the configuration of the fourth embodiment. The same reference numerals are assigned to elements explained in the fourth embodiment.

According to the configuration of the sixth embodiment, by moving the mirror 31 by the movement mechanism 54 to change its position and change the path of the laser light emitted from the external resonator light source 14, it is possible to switch and selectively emit the light output A suppressed in the spontaneous emitted light ingredient from the semiconductor laser diode 11 and the light output B comprised of the direct light output of the external resonator light source 14. Note that the configuration providing the light path changer 30 with a movement mechanism 54 for making the mirror 31 move linearly as explained above to selectively take out the light outputs A and B can be similarly applied to other embodiments besides the fourth embodiment.

Figure 10:
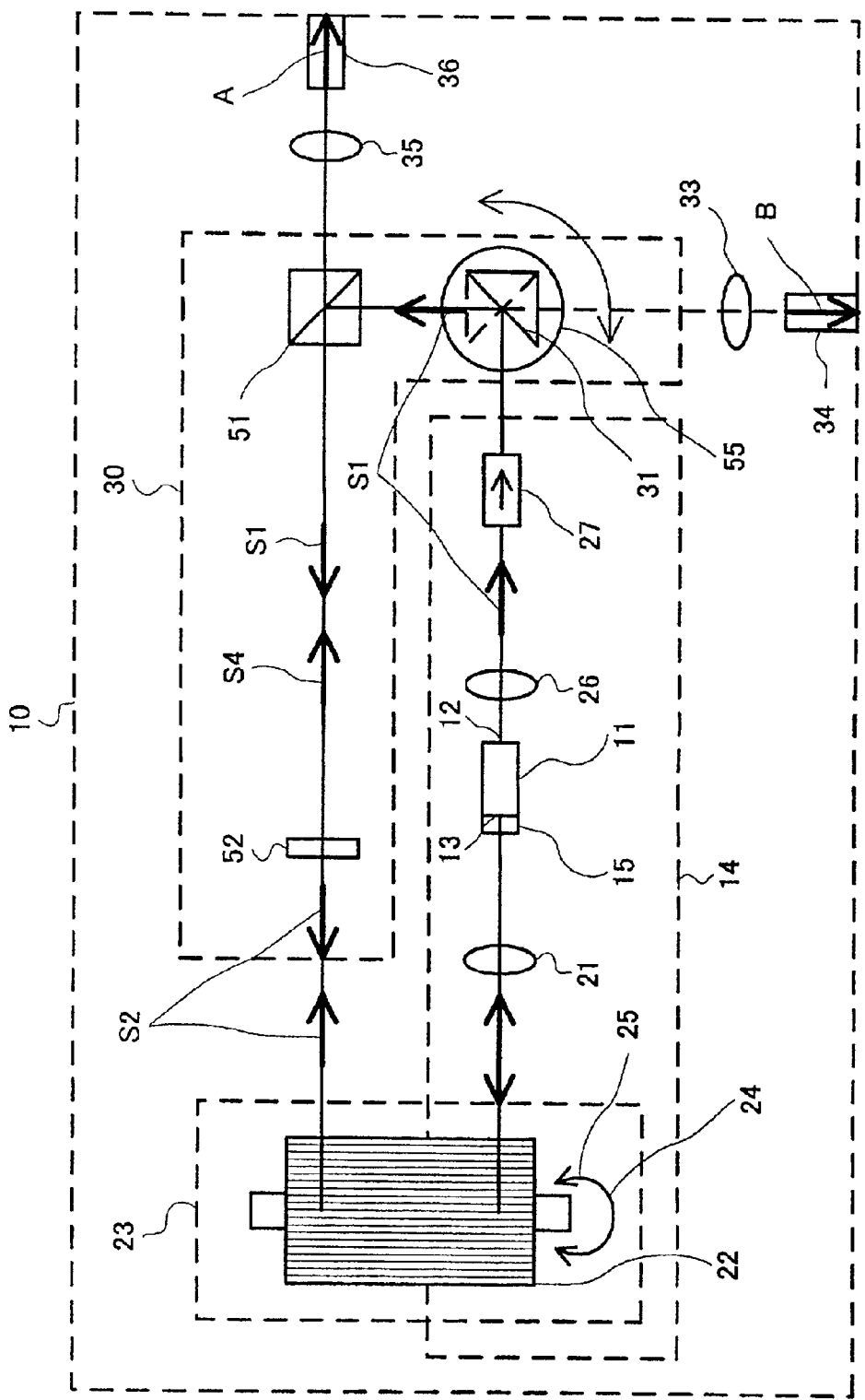
FIG. 10 is a view of the configuration of a wavelength tunable light source equipment according to a seventh embodiment of the present invention.

A seventh embodiment of the wavelength tunable light source equipment according to the present invention will be explained next with reference to FIG. 10. FIG. 10 is a view of the configuration of a wavelength tunable light source equipment according to the seventh embodiment. The seventh embodiment is a modification of the wavelength tunable light source equipment of the fourth embodiment as one example. The wavelength tunable light source equipment according to the seventh embodiment is comprised of the configuration of the fourth embodiment provided with the mirror 31 on a rotation mechanism 55 and provided with the lens 33 and optical fiber 34 in the same way as the sixth embodiment.

According to the configuration of the seventh embodiment, the mirror 31 can be rotated by the rotation mechanism 55 to change the angle of the mirror 31 and change the path of the light output from the external resonator light source 14. Due to this configuration, it is possible to switch and selectively emit between the light output A suppressed in the spontaneous emitted light ingredient from the semiconductor laser diode 11 and the light output B comprised of the direct light output of the external resonator light source 14. Note that the configuration of providing the rotation mechanism 55 for rotating the mirror 31 and selectively taking out the light outputs A and B can be similarly applied to other embodiments as well besides the fourth embodiment.

Figure 11:
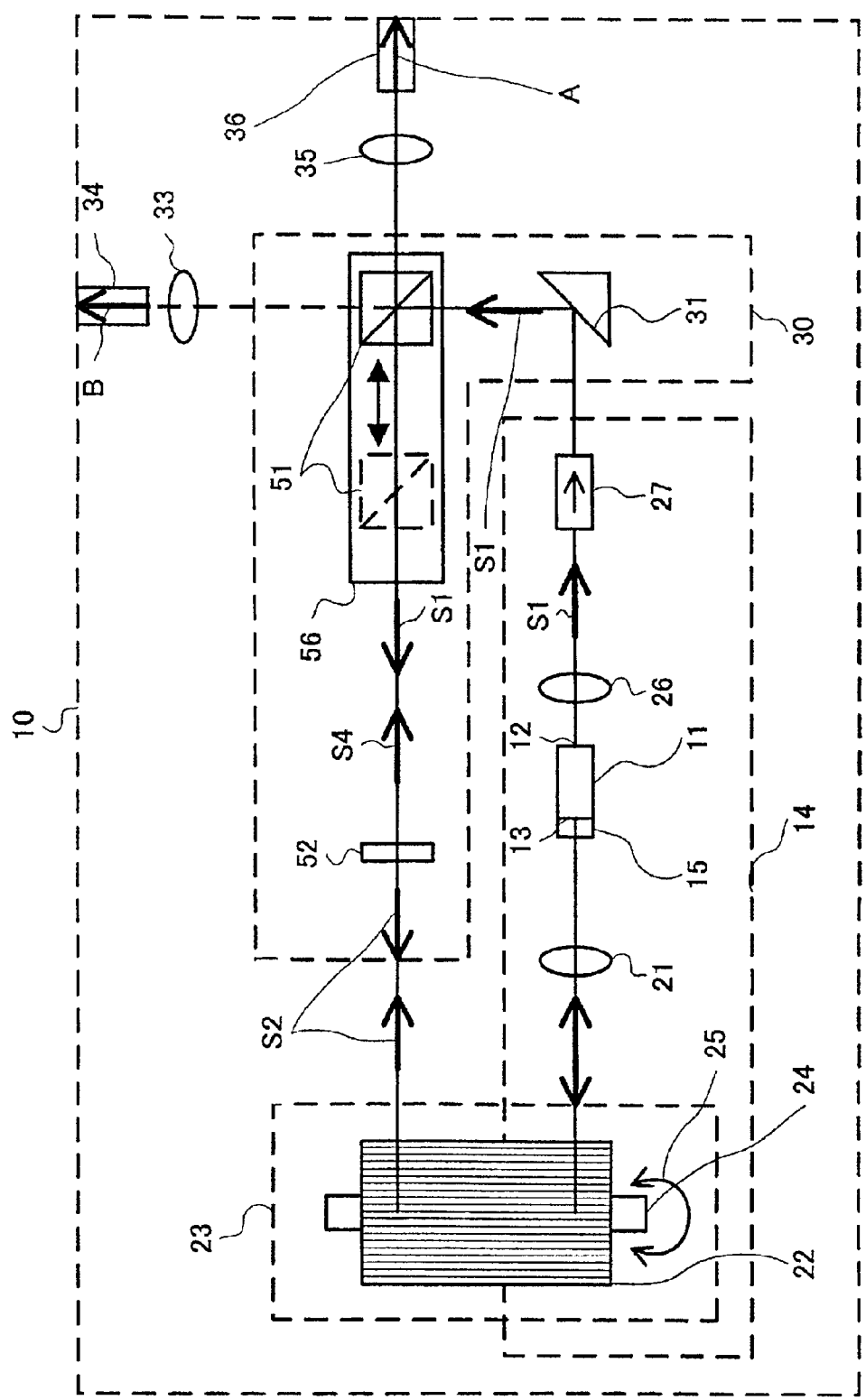
FIG. 11 is a view of the configuration of a wavelength tunable light source equipment according to an eighth embodiment of the present invention.

An eighth embodiment of the wavelength tunable light source equipment according to the present invention will be explained next with reference to FIG. 11. FIG. 11 is a view of the configuration of a wavelength tunable light source equipment according to the eighth embodiment. The configuration of this embodiment is a modification of the wavelength tunable light source equipment according to the fourth embodiment as one example. The wavelength tunable light source equipment according to the eighth embodiment is comprised of the configuration of the fourth embodiment provided with the polarization beam splitter 51 on a movement mechanism 56 and provided with the lens 33 and optical fiber 34.

According to the configuration of this embodiment, the polarization beam splitter 51 is changed in position by the movement mechanism 56 to change the path of the light output from the external resonator light source 14. Due to this, it is possible to switch and emit the light output A with the suppressed spontaneous emitted light ingredient from the semiconductor laser diode 11 and the light output B comprised of the direct light output of the external resonator light source 14. Note that the configuration of providing the light path changer 30 with a movement mechanism 56 for making the polarization beam splitter 51 move straightly and take out the light outputs A and B selectively in the above way can be similarly applied to other embodiments as well besides the fourth embodiment.

Figure 12:
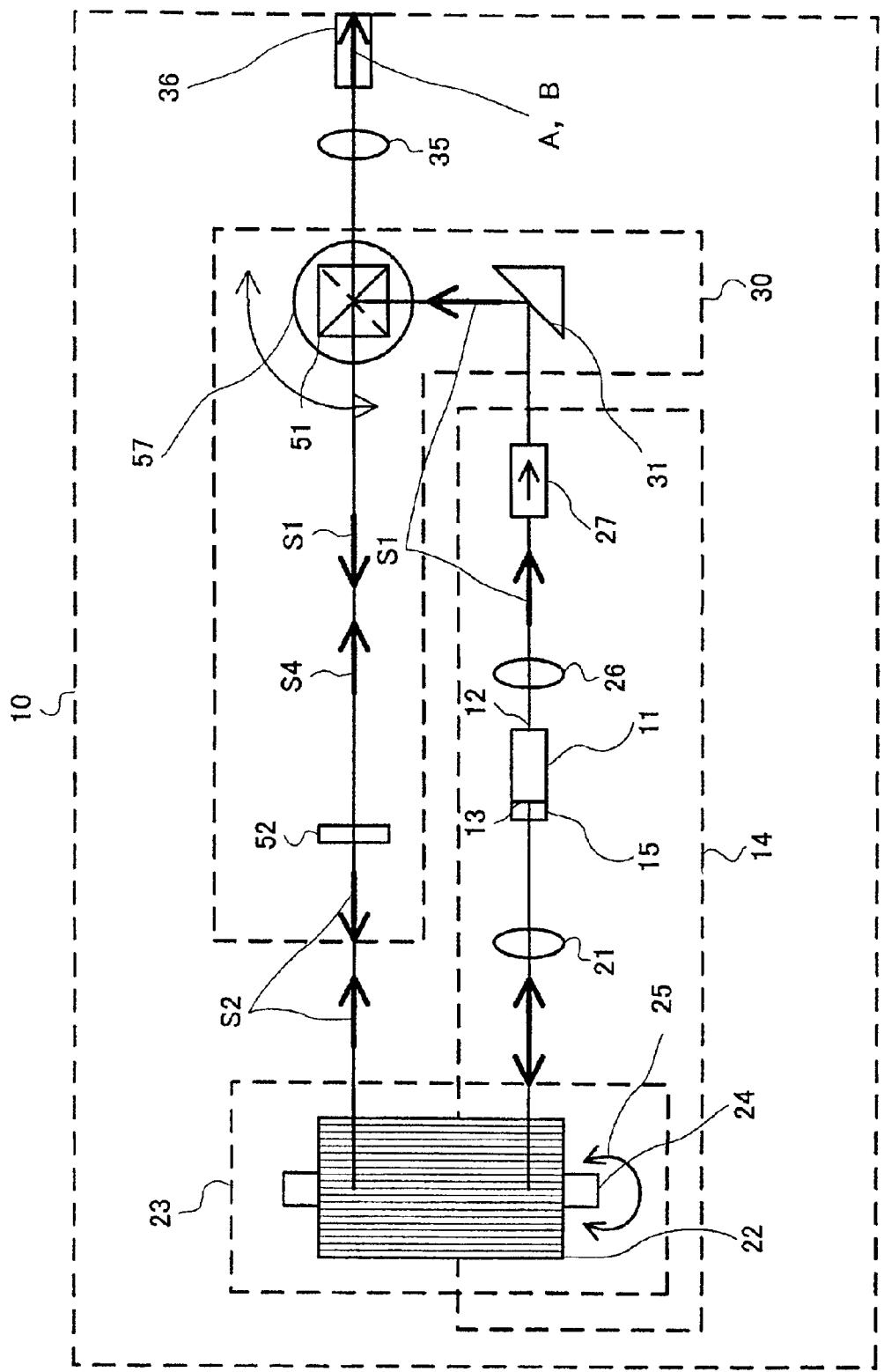
FIG. 12 is a view of the configuration of a wavelength tunable light source equipment according to a ninth embodiment of the present invention.

A ninth embodiment of the wavelength tunable light source equipment according to the present invention will be explained next with reference to FIG. 12. FIG. 12 is a view of the configuration of the wavelength tunable light source equipment according to the ninth embodiment. The configuration of this embodiment is a modification of the wavelength tunable light source equipment of the fourth embodiment as one example. The wavelength tunable light source equipment according to the ninth embodiment is comprised of the configuration of the fourth embodiment provided with the polarization beam splitter 51 on a rotation mechanism 57 and changing the angle of the polarization beam splitter 51 by the rotation mechanism 57 by 90 degrees to change the path of the light output from the external resonator light source 14. According to this configuration, it is possible to switch and emit the light output A suppressed in the spontaneous emitted light ingredient from the semiconductor laser diode 11 and the light output B comprised of the direct light output of the external resonator light source 14. Note that the configuration of providing the light path changer 30 with the rotation mechanism 57 for rotating the polarization beam splitter 51 in this way to selectively take out the light outputs A and B can be similarly applied to the other embodiments as well besides the fourth embodiment.

Figure 13:
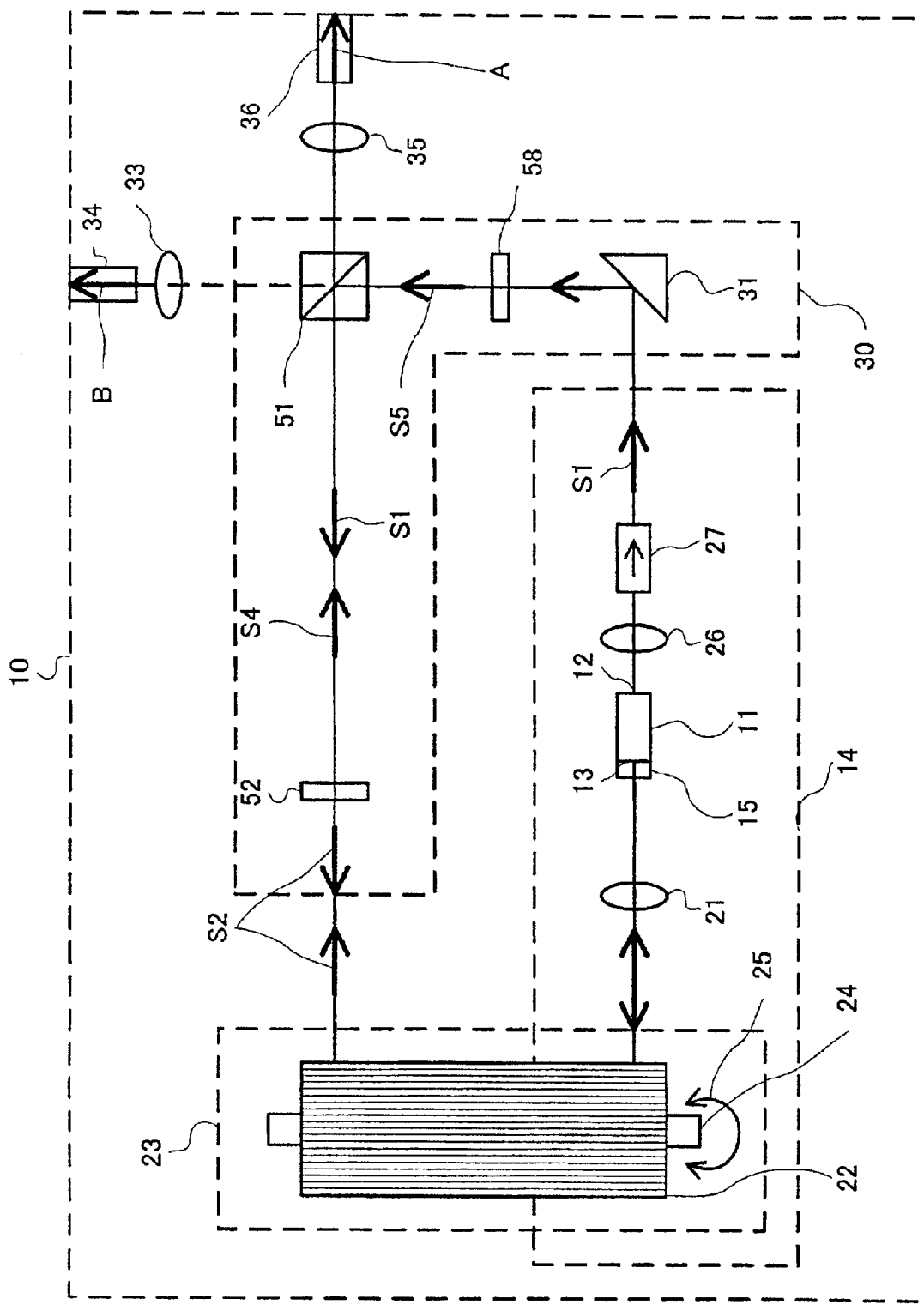
FIG. 13 is a view of the configuration of a wavelength tunable light source equipment according to a 10th embodiment of the present invention.

A 10th embodiment of the wavelength tunable light source equipment according to the present invention will be explained next with reference to FIG. 13. FIG. 13 is a view of the configuration of a wavelength tunable light source equipment according to the 10th embodiment. This embodiment is configured as a modification of the fourth embodiment as an example. The wavelength tunable light source equipment according to the 10th embodiment is comprised of the configuration of the fourth embodiment provided with a Faraday rotator 58 on the light path of the mirror 31 and the polarization beam splitter 51 and provided with a lens 33 and optical fiber 34. The Faraday rotator 58 determines the rotational angle of the polarization considering the loss of the light by the $\lambda/4$ plate 52 and diffraction grating 22 in accordance with the desired ratio of the light output A and the light output B.

The polarized light of the laser light emitted from the external resonator light source 14 is linearly polarized light. The polarization state is S1 as explained above. The laser light emitted from the external resonator light source 14 is changed in path by the mirror 31 and is introduced to the Faraday rotator 58. Due to the Faraday rotator 58, the laser light becomes the polarization state S5 having the desired polarization angle between 0 degree to 90 degrees as shown by FIG. 8E. This laser light is introduced to the polarization beam splitter 51. Part of the polarized light is passed through the polarization beam splitter 51 in response to the angle of incidence, is focused by the lens 33, is introduced to the optical fiber 34, and is emitted as the light output B of the wavelength tunable light source equipment 10. Also, the other laser light reflected by the polarization beam splitter 51 is introduced to the $\lambda/4$ plate 52. The light introduced to the $\lambda/4$ plate 52 changes in polarization state as shown by the polarization state S2 shown in FIG. 8B. The laser light rotated in polarization as with the polarization state S2 is introduced to the diffraction grating 22, is suppressed in the spontaneous emitted light ingredient emitted from the semiconductor laser diode 11, is selected in only the desired wavelength, and again is introduced to the $\lambda/4$ plate 52.

The laser light introduced to and passing through the $\lambda/4$ plate 52 from the diffraction grating 22, as shown by the polarization state S4 shown in FIG. 8D, changes in angle of polarization by 90 degrees from the polarization state S1 and is introduced to the polarization beam splitter 51 again. The polarization beam splitter 51 allows the laser light of the polarization state S4 to pass and be introduced to the lens 35. The laser light is focused by the lens 35, is introduced to the optical fiber 36, and is emitted as the output light A of the wavelength tunable light source equipment 10.

According to the above embodiment, the Faraday rotator 58 is arranged on the light path of the mirror 31 and the polarization beam splitter 51 and the rotational angle of the polarization is determined considering the loss of the light due to the $\lambda/4$ plate 52 and the diffraction grating 22, so it is possible to obtain the desired ratio of the light output A and the light output B. The characterizing configuration of this embodiment can also be applied to other embodiments as well besides the fourth embodiment.

Figure 14:
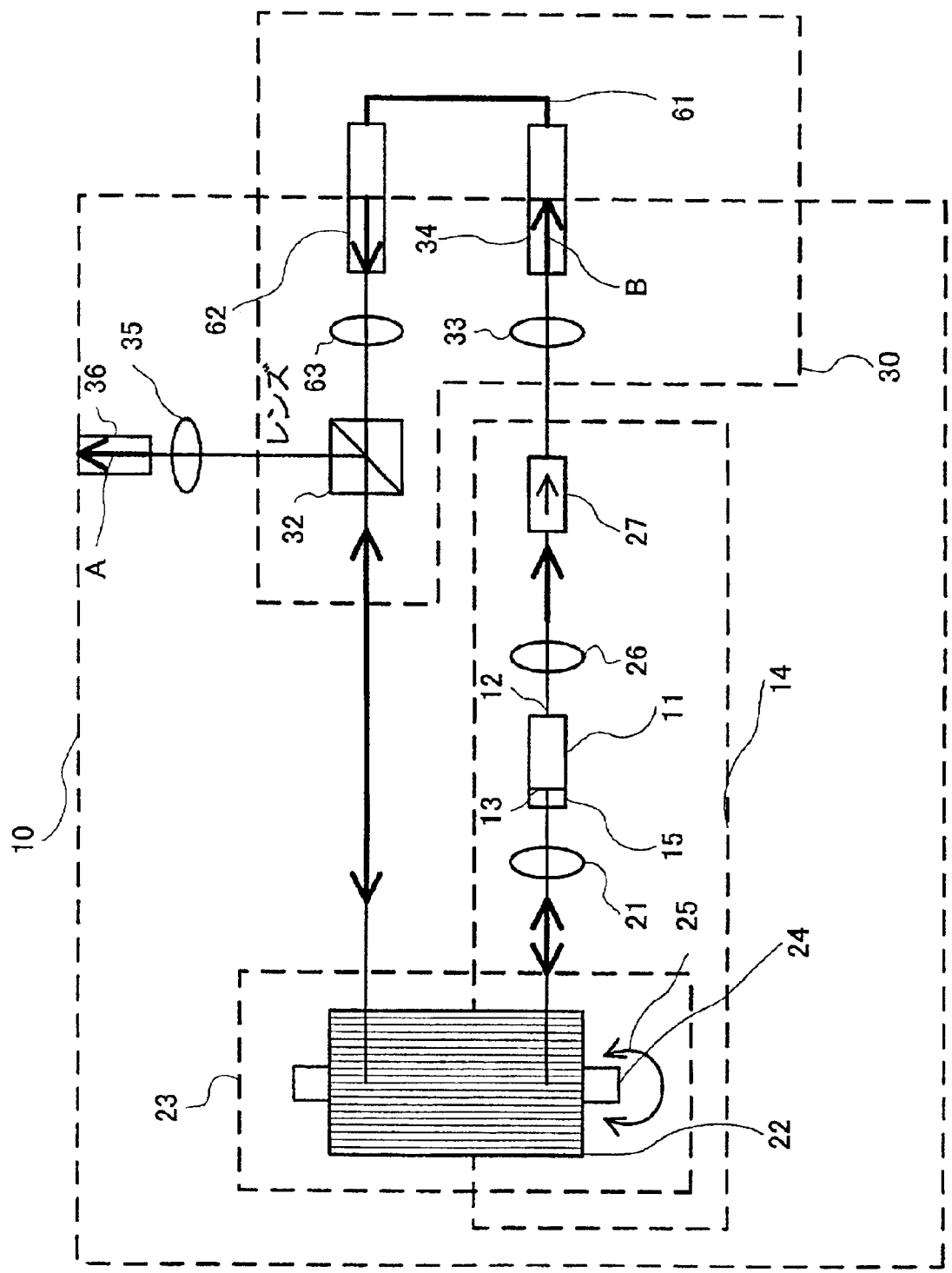
FIG. 14 is a view of the configuration of a wavelength tunable light source equipment according to an 11th embodiment of the present invention.

An 11th embodiment of the wavelength tunable light source equipment according to the present invention will be explained next with reference to FIG. 14. The wavelength tunable light source equipment according to the 11th embodiment is the same in configuration as the first embodiment in regards to the external resonator light source 14. The light emitted from the external resonator light source 14 is directly made the output light of the wavelength tunable light source equipment 10. The light emitted from the external resonator light source 14 is focused through the lens 33, is introduced to the optical fiber 34, and becomes the output of the wavelength tunable light source equipment 10, that is, the light output B.

The wavelength tunable light source equipment 10 is further provided with optical fibers 61 and 62 and a lens 63. By the light path based on this configuration, the light introduced from the optical fibers 61 and 62 is converted to parallel light and is introduced to the non-polarization beam splitter 32. The optical fiber 62, the lens 63, and non-polarization beam splitter 32 are adjusted in position so as to select the wavelength by the same wavelength as the lasing wavelength of the external resonator light source 14. The light striking from the optical fiber 62 is selected in wavelength by the diffraction grating 22, reflected by the non-polarization beam splitter 32 in only the same wavelength as the external resonator light source 14, focused by the lens 35, and output from the optical fiber 36.

According to the configuration of the 11th embodiment, by connecting the optical fiber 34 and optical fiber 62 by the optical fiber 61, it is possible to switch the light output of the wavelength tunable light source equipment 10 from the light output B including the spontaneous emitted light ingredient emitted from the semiconductor laser diode 11 to the light output A suppressed in the spontaneous emitted light ingredient emitted from the semiconductor laser diode 11. The characterizing configuration of the 11th embodiment can also be applied in combination with the other embodiments.

Figure 15:
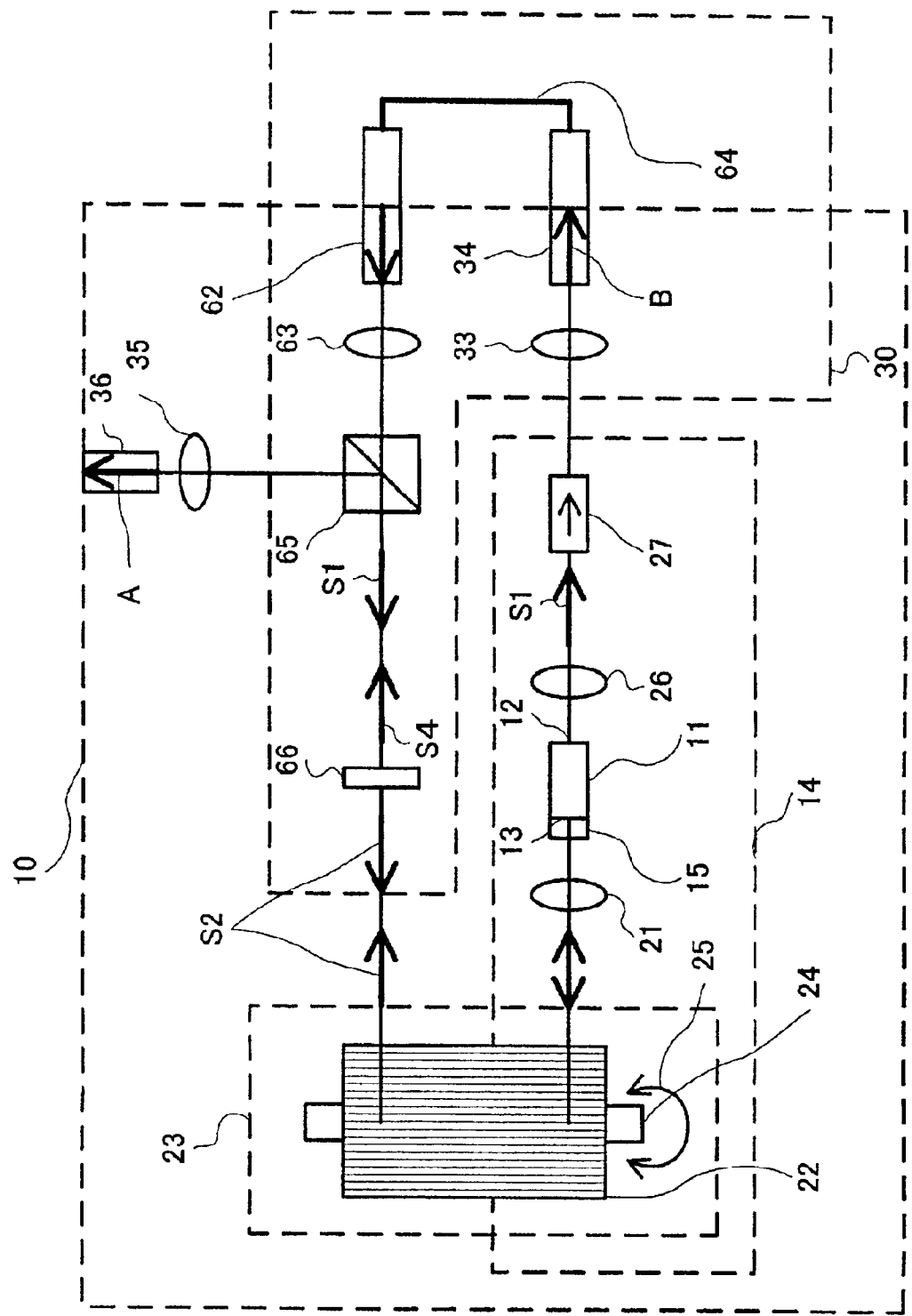
FIG. 15 is a view of the configuration of a wavelength tunable light source equipment according to a 12th embodiment of the present invention.

A 12th embodiment of the wavelength tunable light source equipment according to the present invention will be explained next with reference to FIG. 15. The wavelength tunable light source equipment according to the 12th embodiment is a modification of the 11th embodiment. In the 12th embodiment, elements substantially the same as the elements explained in the 11th embodiment are assigned the same reference numerals. The wavelength tunable light source equipment according to the 12th embodiment can be comprised by the configuration of the 11th embodiment using the optical fibers 34 and 62 and a polarization plane storing fiber as the optical fiber connecting the same. It is also possible to use the polarization plane storing fiber for the optical fiber 36. According to the configuration of the 12th embodiment, by matching all polarization planes and arranging the polarization beam splitter 65 and λ/4 plate 66 as illustrated, the splitting loss of the non-polarization beam splitter 32 in the 11th embodiment can be eliminated and the light output A suppressed in the spontaneous emitted light ingredient of the semiconductor laser diode 11 can be emitted as the light output of the wavelength tunable light source equipment 10.

Further, the embodiment can be modified in the following way as another example of its application. If considering the polarization dependency of the diffraction grating 22, the state of the polarized light introduced to the diffraction grating 22 need not be fixed to S2. The polarization angle of the introduced light can be adjusted by the polarization plane storing fiber 62 to give the optimal angle to the diffraction grating 22 or a Faraday rotator can be used instead of the λ/4 plate. The characterizing configuration of this embodiment can also be applied in combination with the other embodiments.

Figure 16:
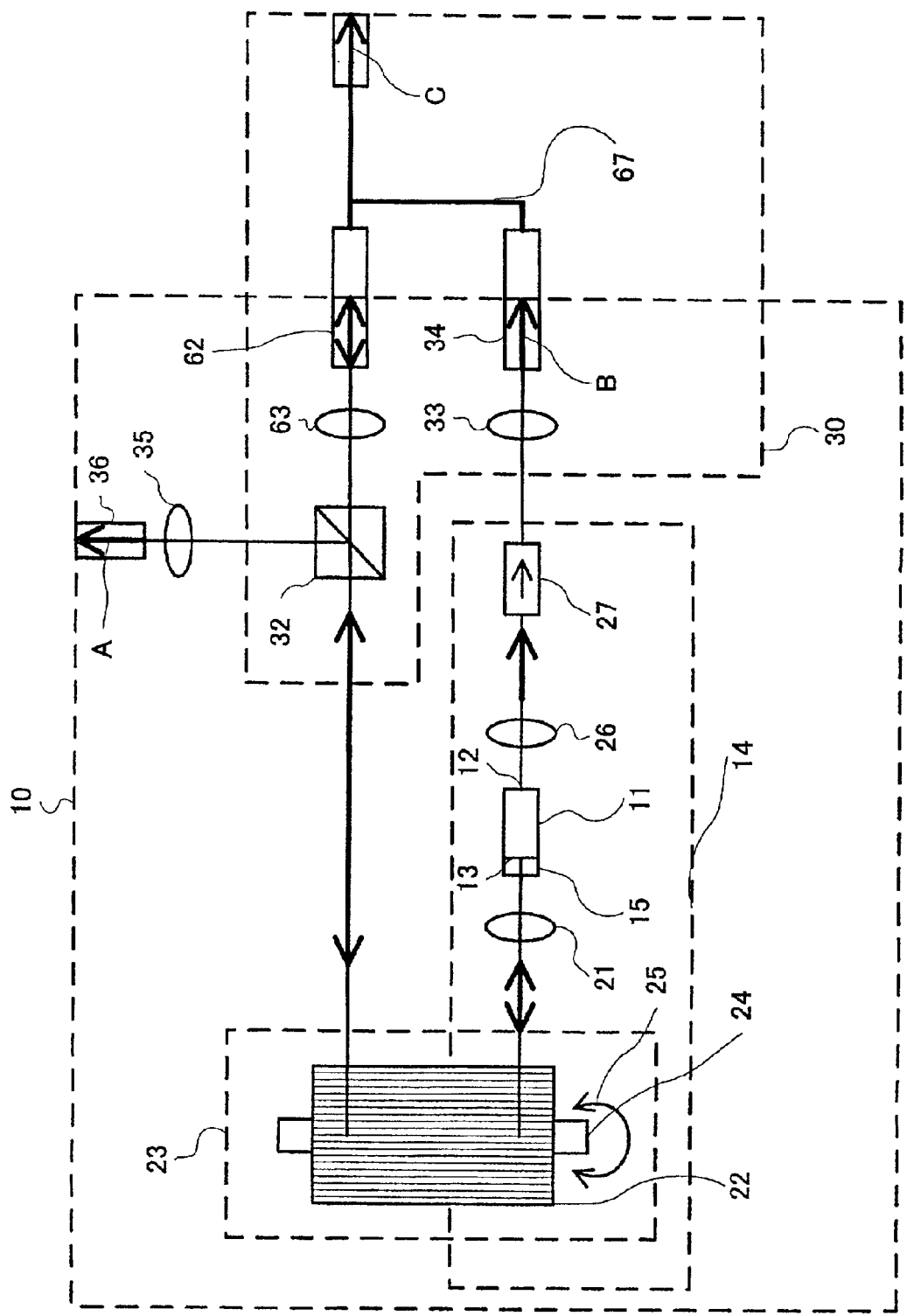
FIG. 16 is a view of the configuration of a wavelength tunable light source equipment according to a 13th embodiment of the present invention.

A 13th embodiment of the wavelength tunable light source equipment according to the present invention will be explained next with reference to FIG. 16. The wavelength tunable light source equipment according to the 13th embodiment is a modification of the 11th embodiment. In the wavelength tunable light source equipment according to the 13th embodiment, an optical fiber coupler 67 is used instead of the optical fiber 61 provided for switching the output of the wavelength tunable light source equipment 10 in the 11th embodiment. In accordance with the splitting ratio of the optical fiber coupler 67, it is possible to simultaneously emit two outputs of the light output A suppressed in the spontaneous emitted light ingredient emitted from the semiconductor laser diode 11 and the light output C not suppressed in the spontaneous emitted light ingredient emitted from the semiconductor laser diode 11 as the light output of the wavelength tunable light source equipment 10. The characterizing configuration of this embodiment can also be applied to the other embodiments.

Figure 17:
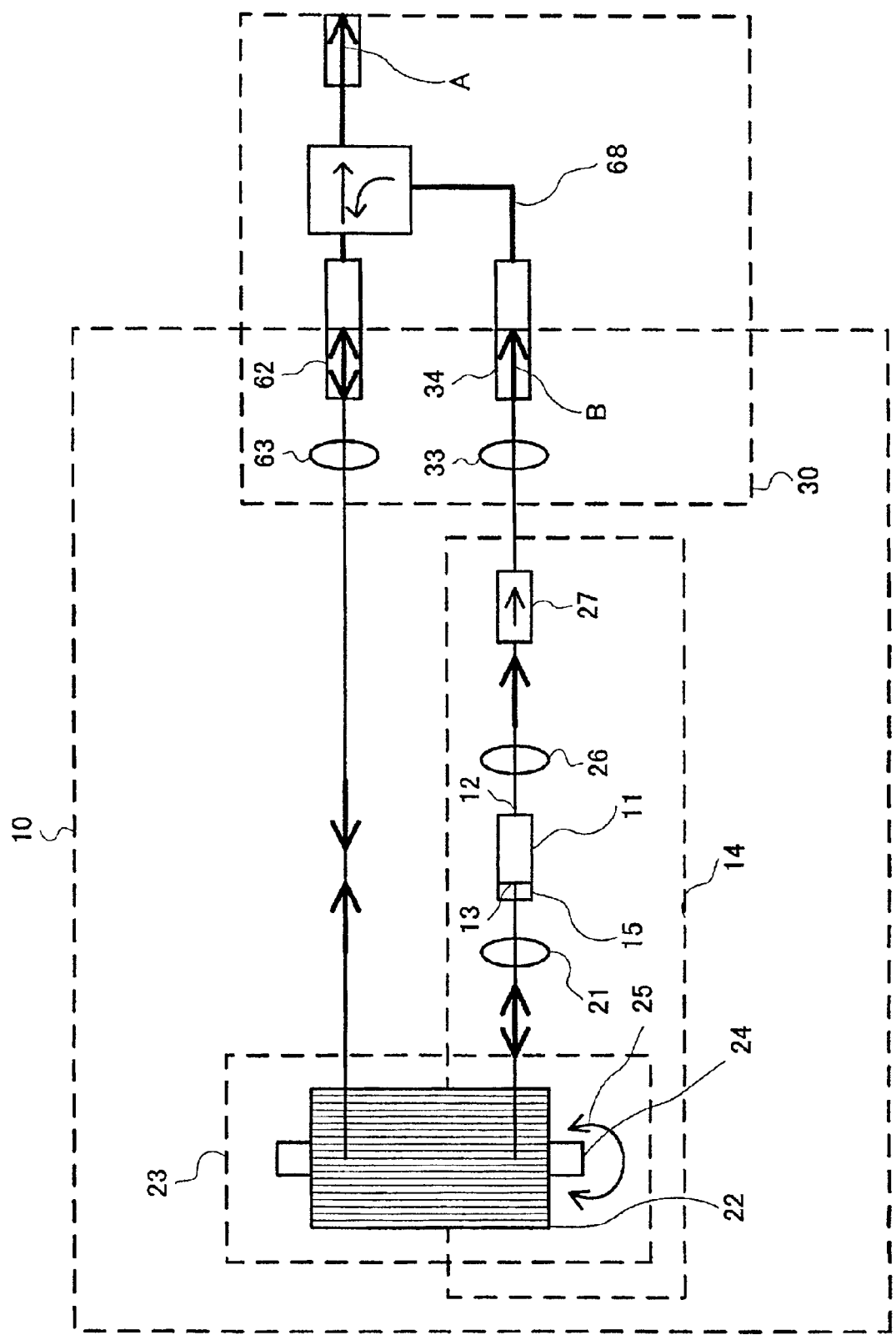
FIG. 17 is a view of the configuration of a wavelength tunable light source equipment according to a 14th embodiment of the present invention.

A 14th embodiment of the wavelength tunable light source equipment according to the present invention will be explained next with reference to FIG. 17. The 14th embodiment is a modification of the 11th embodiment. The wavelength tunable light source equipment according to the 14th embodiment is comprised of the configuration of the 11th embodiment using an optical circulator 68 instead of the optical fiber 61 as a means for switching the light output of the wavelength tunable light source equipment 10 from the light output B including the spontaneous emitted light ingredient emitted from the semiconductor laser diode 11 to the light output A suppressed in the spontaneous emitted light ingredient emitted from the semiconductor laser diode 11. The optical circulator 68 is also provided with the function of changing the light path by the non-polarization beam splitter 32 shown in FIG. 14. According to this embodiment, there is no splitting loss due to the non-polarization beam splitter 32, so it is possible to maintain the intensity of the light output including the spontaneous emitted light ingredient emitted from the semiconductor laser diode 11 higher compared with the 11th embodiment. The characterizing configuration of this embodiment can also be applied to the other embodiments.

Figure 18:
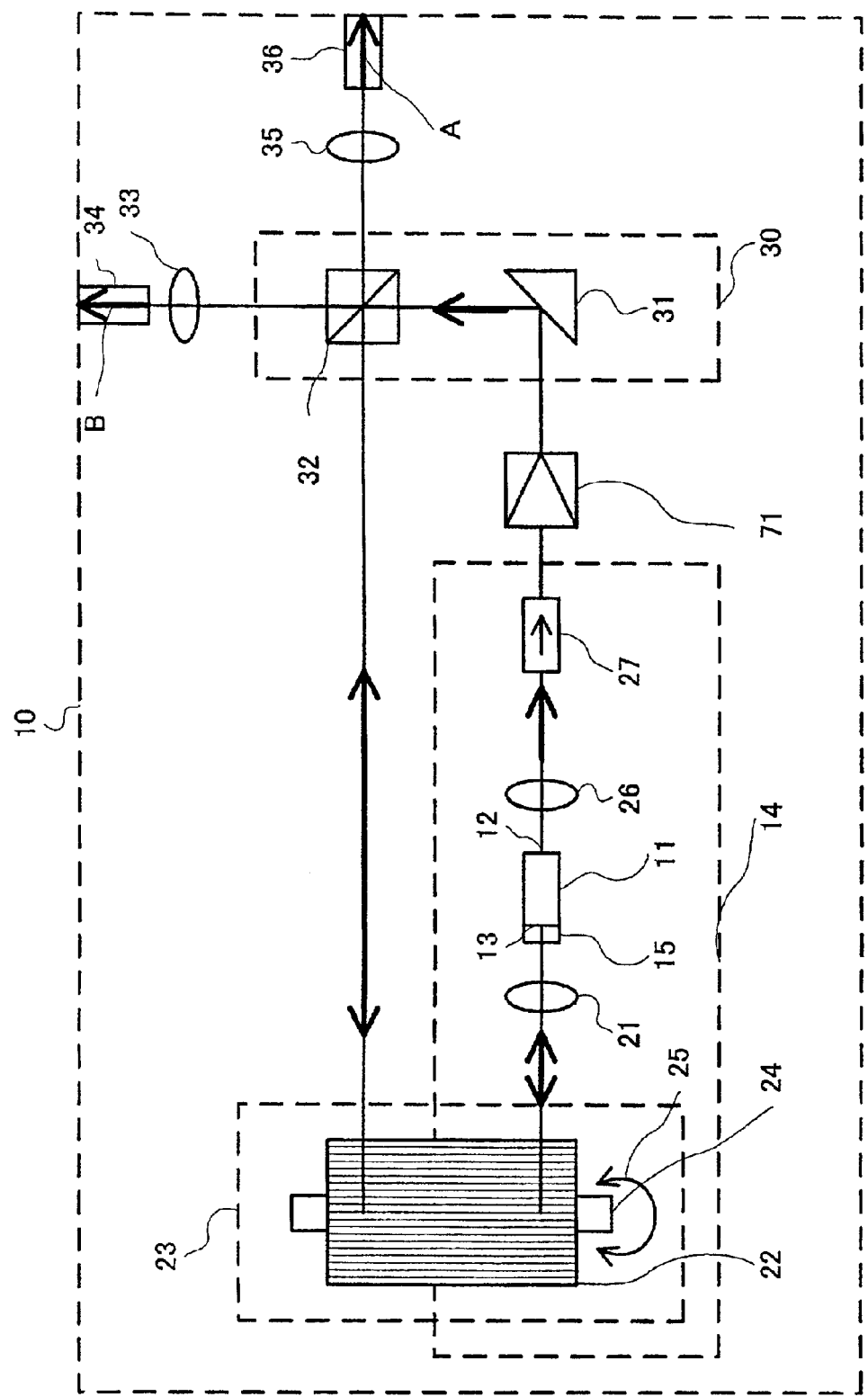
FIG. 18 is a view of the configuration of a wavelength tunable light source equipment according to a 15th embodiment of the present invention.

A 15th embodiment of the wavelength tunable light source equipment according to the present invention will be explained next with reference to FIG. 18. The 15th embodiment is the same as the first embodiment in the ingredients included in the external resonator light source 14. In the wavelength tunable light source equipment according to this embodiment, as shown in (a) of FIG. 20, the laser light emitted from the external resonator light source 14 is light output oscillated as laser at the desired wavelength λ1 and including the spontaneous emitted light generated from the semiconductor laser diode 11. If this laser light is input to the optical amplifier 71, it is amplified and becomes the light output as shown in (b) of FIG. 20 with the spontaneous emitted light generated from the optical amplifier 71 added. The optical amplifier 71, while not shown, actually is comprised of a semiconductor amplifier, a lens for coupling light with this semiconductor amplifier, a lens for converting the light emitted from the semiconductor amplifier to parallel light, and excitation current source for causing a gain at the semiconductor amplifier. The laser light amplified by the optical amplifier 71 passes through the mirror 31 and the non-polarization beam splitter 32 in part, is focused at the optical fiber 34 by the lens 33, and becomes the light output of the wavelength tunable light source 10 as the light output B including the spontaneous emitted light ingredient. Further, the laser light reflected by the non-polarization beam splitter 32 is selected in wavelength by the diffraction grating 22 set to the same wavelength as the lasing wavelength of the external resonator light source 14, passes through the non-polarization beam splitter 32, is introduced to the optical fiber 36 by the lens 35, and is emitted from the wavelength tunable light source equipment 10 as the light output A suppressed in the spontaneous emitted light ingredient emitted from the semiconductor laser diode 11 and the optical fiber amplifier 71. The waveform of this light output A is shown in (c) of FIG. 20.

According to the above embodiment, by providing an optical amplifier 71 between the external resonator light source 14 and the light path changer 30 and amplifying the laser light, it is possible to obtain a larger level light output. Further, by providing the optical amplifier, the spontaneous emitted light noise of the optical amplifier is added, but the spontaneous emitted light ingredient is suppressed by the wavelength selection structure of the diffraction grating. The optical amplifier can be applied to the above embodiments as well.

Figure 19:
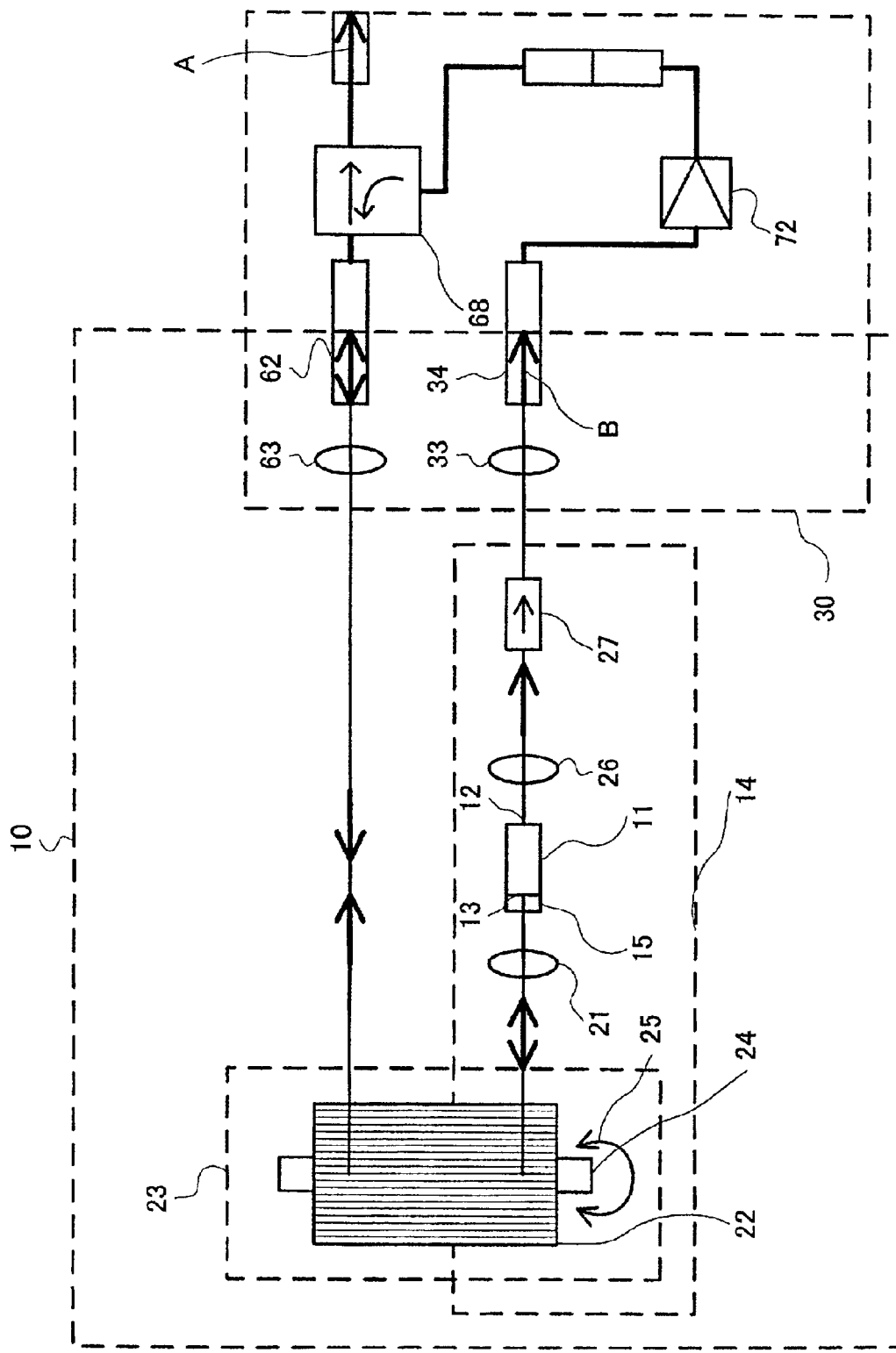
FIG. 19 is a view of the configuration of a wavelength tunable light source equipment according to a 16th embodiment of the present invention.

A 16th embodiment of the wavelength tunable light source equipment according to the present invention will be explained next with reference to FIG. 19. This embodiment is a modification of the 14th embodiment. In the configuration of the 14th embodiment, an optical amplifier 72 is connected between the optical fiber 34 of the wavelength tunable light source equipment 10 and the optical circulator 68. The light output B from the optical fiber 34, as shown by (a) of FIG. 20, is light output oscillated by the desired wavelength λ1 and including the spontaneous emitted light generated from the semiconductor laser diode 11. If this laser light is input to the optical amplifier 72, the laser light will be amplified and the spontaneous emitted light generated from the optical amplifier 72 will be added resulting in the light output as shown by (b) of FIG. 20. The laser light amplified at the optical amplifier 72 passes through the optical circulator 68, the optical fiber 62, and the lens 63 and is selected in wavelength by the diffraction grating 22. The laser light, as shown in (c) of FIG. 20, is emitted as light output with the suppressed spontaneous emitted light of the semiconductor laser diode 11 and spontaneous emitted light of the optical amplifier 81 from the wavelength tunable light source equipment 10 through the lens 63, optical fiber 62, and optical circulator 68 as the light output A. According to this embodiment, it is possible to increase the light output by the optical amplifier 72.

Figure 21:
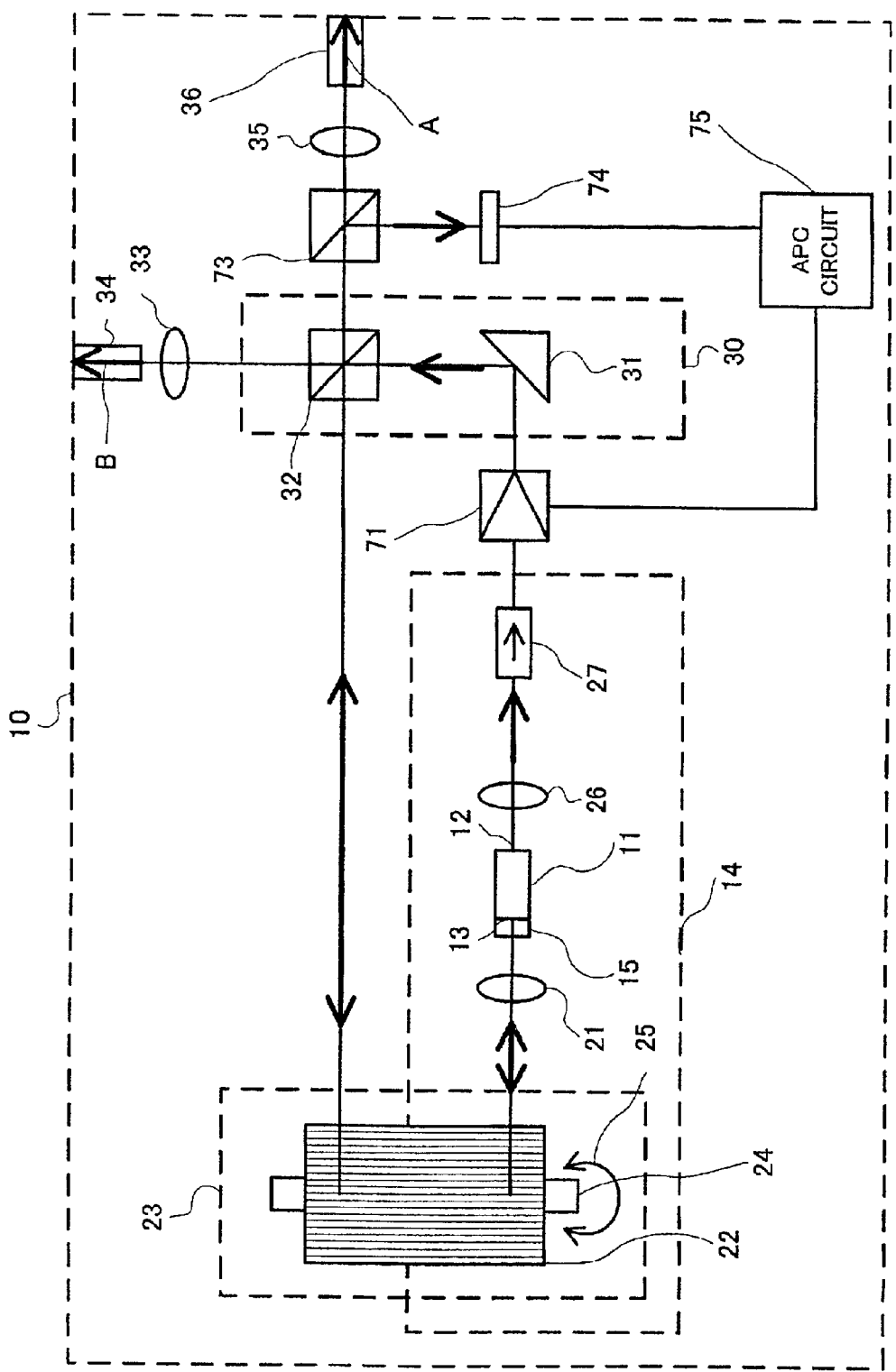
FIG. 21 is a view of the configuration of a wavelength tunable light source equipment according to a 17th embodiment of the present invention.

A 17th embodiment of the wavelength tunable light source equipment according to the present invention will be explained next with reference to FIG. 21. This embodiment is a modification of the 15th embodiment. In FIG. 21, elements substantially the same as the elements explained in FIG. 18 are assigned the same reference numerals. The wavelength tunable light source equipment according to this embodiment is comprised of the configuration of the 15th embodiment provided with a non-polarization beam splitter 73 between the non-polarization beam splitter 32 and the lens 35, converting the light intensity to an electrical signal by a photodetector 74, detecting the change of the light output by an automatic power control circuit 75, and adjusting the gain of an optical amplifier 71 so that the electrical signal from the photodetector 71 becomes constant at all times. Due to this configuration, it is possible to adjust the output of the optical amplifier 71 and possible to maintain it at a desired level.

Figure 22:
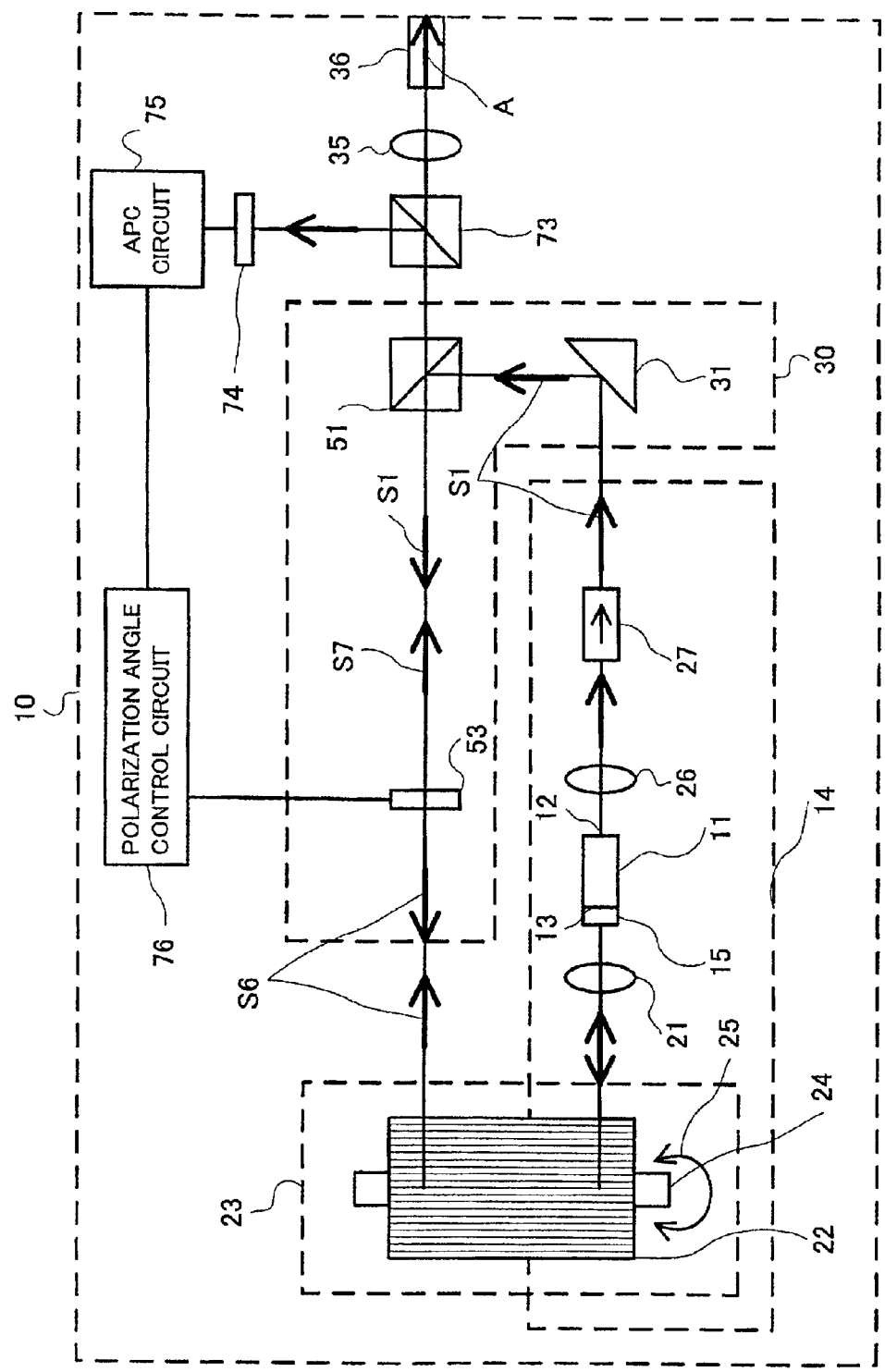
FIG. 22 is a view of the configuration of a wavelength tunable light source equipment according to an 18th embodiment of the present invention.
Figure 23:
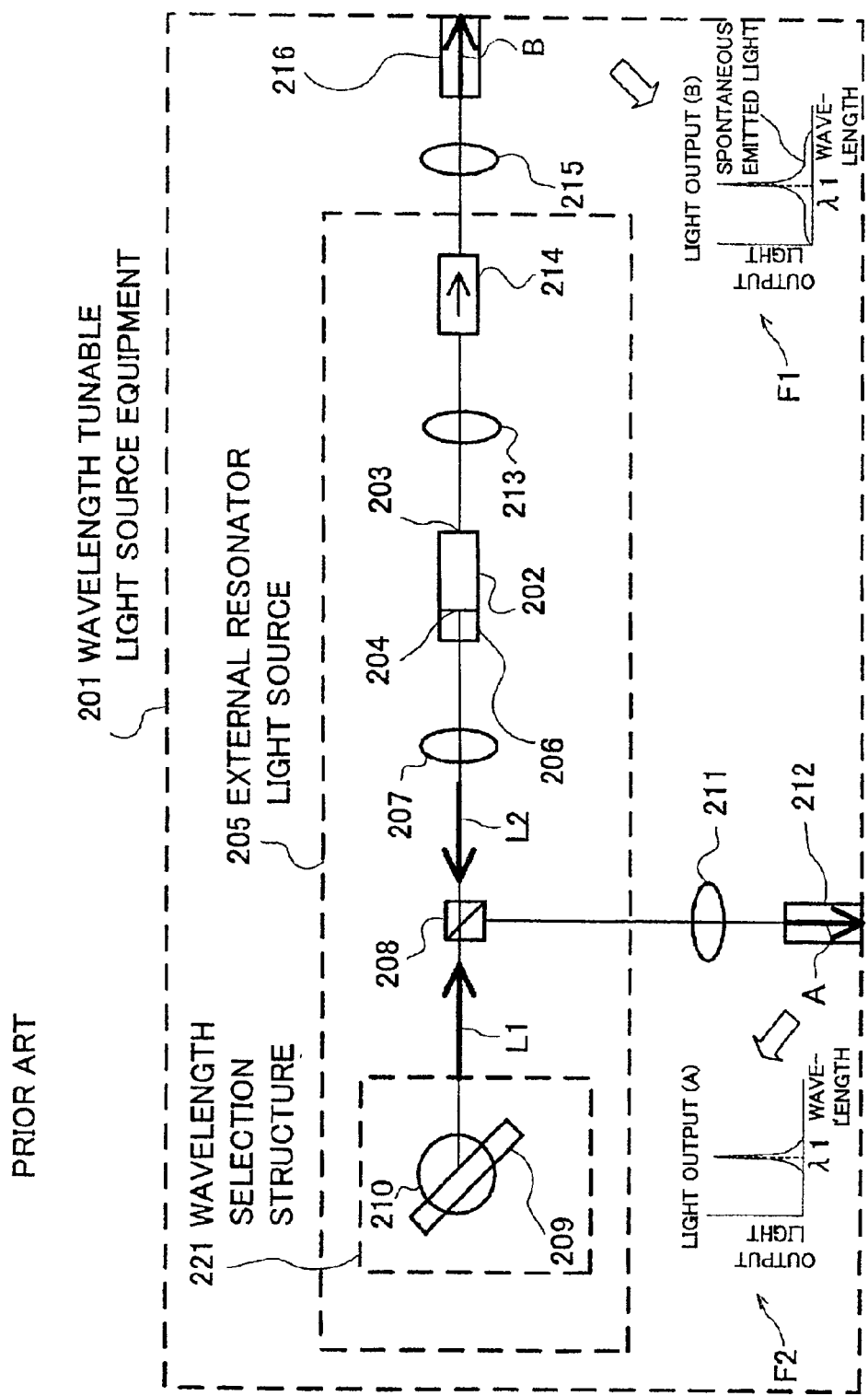
FIG. 23 is a view of the configuration of a wavelength tunable light source equipment suppressing spontaneous emitted light according to the related art.
Figure 24:
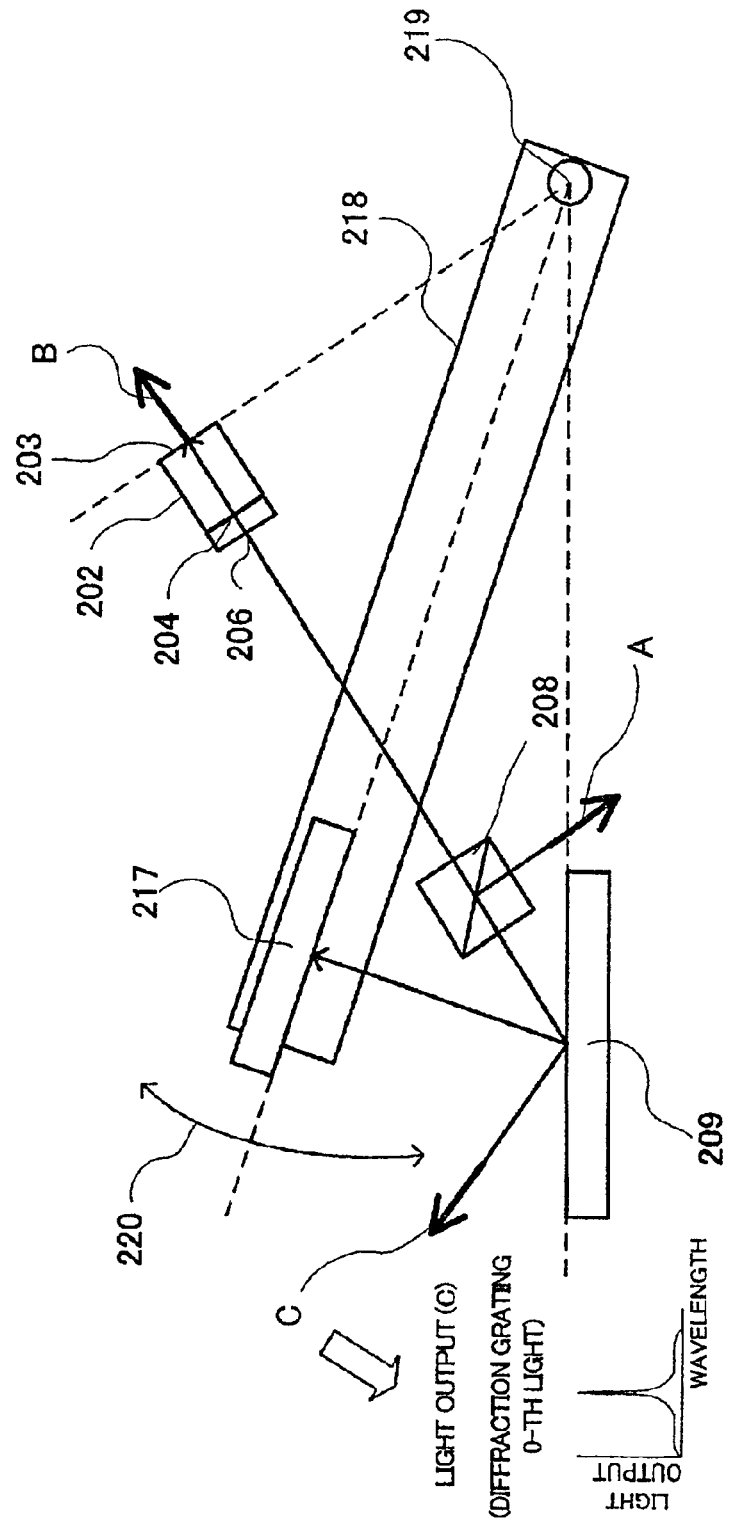
FIG. 24 is a view of the configuration of a wavelength tunable light source equipment according to a Litman layout suppressing the spontaneous emitted light according to the related art.

An 18th embodiment of the wavelength tunable light source equipment according to the present invention will be explained next with reference to FIG. 22. This embodiment is a modification of the fifth embodiment and consists of the fifth embodiment plus the configuration of the 17th embodiment. The wavelength tunable light source equipment 10 according to this embodiment is comprised of the configuration of the fifth embodiment provided with a non-polarization beam splitter 73 between the polarization beam splitter 51 and the lens 35, converting the light intensity to an electrical signal by a photodetector 74, detecting the change of the light output by an APC circuit 75, and adjusting the rotational angle of polarization by the Faraday rotator 53 by a polarization angle control circuit 76 so that the electrical signal from the photodetector 74 becomes always constant.

The polarization states are shown by the above FIGS. 8A to 8G. The change in the angle of the polarization state by the Faraday rotator 53 is in the range of 0 degree at the minimum to 45 degrees at the maximum as shown by the polarization state S6 of FIG. 8F. When light is selected in wavelength by the diffraction grating 22 and again passes through the Faraday rotator 53, the polarization state changes in angle by double the polarization state S6 as shown by the polarization state S7 of FIG. 8G. Laser light having this polarization state passes through the polarization beam splitter 51, is focused at the optical fiber 36 by the lens 35, then is emitted from the wavelength tunable light source 10 as the light output A. At this time, the intensity of the light passing through the polarization beam splitter 51 changes according to the angle of the polarization state S7. Therefore, the light output of the wavelength light tunable source 10 can be made constant at all times.

The characterizing configurations of the above embodiments can of course be suitably combined to realize new embodiments in any way within the scope of the technical idea of the present invention. Further, the configurations, shapes, and relative dispositions explained in the embodiments are only shown schematically to an extent enabling understanding of the present invention. Further, the numerical values and the materials of the ingredients are only shown by way of illustration.

As clear from the above explanation, according to the present invention, there are the following effects:

The wavelength tunable light source equipment according to the present invention configured not provided with a beam splitter inside the external resonator light source, but provided with a light path changer at the outside of the external resonator light source and deploying a desired beam splitter inside it to return part of the laser light to a diffraction grating or other wavelength selection structure can emit laser light of a desired wavelength suppressed in the spontaneous emitted light ingredient emitted from a gain medium inside the external resonator light source at a high output.

The wavelength tunable light source equipment according to the present invention configured provided with a light path changer at the outside of the external resonator light source and provided with a non-polarization beam splitter having a desirable splitting ratio inside the light path changer can set to a desired ratio and emit laser light including the spontaneous emitted light ingredient emitted from a gain medium inside the external resonator light source and laser light suppressed in the spontaneous emitted light ingredient.

The wavelength tunable light source equipment according to the present invention is configured to provide a light path changer including a mirror and polarization beam splitter at the outside of the external resonator light source and pass the laser light split from the polarization beam splitter through a λ/4 plate to return it to the wavelength selection structure. Therefore, a ratio between laser light including the spontaneous emitted light ingredient emitted from a gain medium in the external resonator light source and laser light with the suppressed spontaneous emitted light ingredient can be set to a desired ratio by adjusting the angle of incidence of the laser light to the polarization beam splitter. Further, it can emit at a high output the laser light of a desired wavelength with the suppressed spontaneous emitted light ingredient emitted from a gain medium inside the external resonator light source.

The wavelength tunable light source equipment according to the present invention using a Faraday rotator can obtain a large light output and can stabilize the light output.

The wavelength tunable light source equipment according to the present invention configured to suitably set the splitting ratio at the non-polarization beam splitter or polarization beam splitter can set the ratio of the light intensity of the two light outputs to a desired predetermined value.

The wavelength tunable light source equipment according to the present invention configured provided with a light path changer including a mirror and beam splitter at the outside of the external resonator light source and provided with a mechanism for making the mirror or the beam splitter move or rotate inside the light path changer or various light path switching means can switch and emit laser light including the spontaneous emitted light ingredient emitted from a gain medium inside the external resonator light source and laser light suppressed in the spontaneous emitted light ingredient.

The wavelength tunable light source equipment according to the present invention configured to amplify the intensity of light output of the laser light of the desired wavelength at the optical amplifier and simultaneously suppress both spontaneous emitted light emitted from the gain medium in the external resonator light source and spontaneous emitted light emitted from the optical amplifier can emit laser light of the desired wavelength suppressed in the spontaneous emitted light and extremely strong in light output and further can easily keep the intensity of light output suppressed in the spontaneous emitted light ingredient stable.

The wavelength tunable light source equipment according to the present invention designed to take out part of the light output and feed it back to an optical amplifier or Faraday rotator to adjust the optical amplification rate or polarization etc. can stabilize and keep constant the light output.

The present disclosure relates to subject matter contained in Japanese Patent Application No. 2002-29945, filed on Feb. 6, 2002, the disclosure of which is expressly incorporated herein by reference in its entirety.

What is claimed is:

1. A wavelength tunable light source comprising:
    an external resonator light source having a wavelength selection structure and an isolator, and oscillating at a wavelength selected by the wavelength selection structure, the wavelength selection structure being moveable to vary the wavelength selected thereby; and
    a light path changer directing at least part of the light emitted from the external resonator light source, which includes a spontaneous emitted light ingredient from the light source, to said wavelength selection structure so that a first wavelength of said light, emitted from said external resonator light source, travels along a first optical path, and a second wavelength of light, reflected by the light path changer to the wavelength selection structure, travels along a second optical path,
    wherein the light path changer adjusts an angle of incidence of the second wavelength of light such that the first wavelength of said light and the second wavelength of light become synchronized.

2. A wavelength tunable light source equipment as set forth in claim 1, wherein said wavelength selection structure is a diffraction grating.

3. A wavelength tunable light source equipment as set forth in claim 1, wherein said wavelength selection structure is a structure of a combination of a first diffraction grating and any one of a mirror and a second diffraction grating.

4. A wavelength tunable light source equipment as set forth in claim 1, wherein said wavelength selection structure further comprises a tunable wavelength filter.

5. A wavelength tunable light source equipment as set forth in claim 1, wherein said light path changer is provided with a non-polarization beam splitter for introducing at least part of said light emitted from said external resonator light source to said wavelength selection structure.

6. A wavelength tunable light source equipment as set forth in claim 2, further comprising:
    a polarization beam splitter and λ/4 plate inside said light path changer when said light emitted from said external resonator light source is linearly polarized light with a fixed direction of polarization;
    wherein said light emitted from said external resonator light source passes through said polarization beam splitter and said λ/4 plate in that order, and introduced to said wavelength selection structure and light reflected by said wavelength selection structure passes through said λ/4 plate and said polarization type beam splitter in that order and taken out as said output light.

7. A wavelength tunable light source equipment as set forth in claim 2, further comprising:
    a polarization beam splitter and Faraday rotator inside said light path changer when said light emitted from said external resonator light source is linearly polarized light with a fixed direction of polarization, wherein
    said light emitted from said external resonator light source passes through said polarization beam splitter and said Faraday rotator in that order, and introduced to said wavelength selection structure and light reflected by said wavelength selection structure passes through said Faraday rotator and said polarization type beam splitter in that order and taken out as said output light.

8. A wavelength tunable light source equipment as set forth in claim 5, wherein said non-polarization beam splitter sets a splitting ratio, produces light output based on said light reflected by said external resonator light source and light output based on light emitted from said wavelength selection structure based on that splitting ratio, and the splitting ratio is set such that the ratio of light intensity of the two light outputs becomes a predetermined value.

9. A wavelength tunable light source equipment as set forth in claim 6, wherein said polarization beam splitter sets a splitting ratio, produces light output based on said light reflected by said external resonator light source and light output based on light emitted from said wavelength selection structure based on that splitting ratio, and the splitting ratio is set such that the ratio of light intensity of the two light outputs becomes a predetermined value.

10. A wavelength tunable light source equipment as set forth in claim 1, wherein said light path changer is provided with a light path switching means for creating a light path for directing light emitted from said external resonator light source to said wavelength selection structure and taking out light reflected by said wavelength selection structure as first output light and a light path for taking out light emitted from said external resonator light source as second output light without passing it through said wavelength selection structure.

11. A wavelength tunable light source equipment as set forth in claim 10, wherein said light path switching means is a mechanism for making a mirror move or rotate.

12. A wavelength tunable light source equipment as set forth in claim 10, wherein said light path switching means is a mechanism for making a polarization beam splitter or a non-polarization beam splitter move or rotate.

13. A wavelength tunable light source equipment as set forth in claim 10, wherein said light path switching means is a mechanism for changing a polarization state of light.

14. A wavelength tunable light source equipment as set forth in claim 10, wherein said light path switching means is a mechanism for changing a connection of an optical component receiving an optical signal from the wavelength tunable light source equipment.

15. A wavelength tunable light source equipment as set forth in claim 14, wherein said optical component is an optical fiber.

16. A wavelength tunable light source equipment as set forth in claim 14, wherein said optical component is an optical fiber coupler.

17. A wavelength tunable light source equipment as set forth in claim 14, wherein said optical component is an optical circulator.

18. A wavelength tunable light source equipment as set forth in claim 1, further provided with an optical amplifier in the light path at a downstream side of an emitting part of said external resonator light source and amplifying light emitted from said external resonator light source by this optical amplifier.

19. A wavelength tunable light source equipment as set forth in claim 18, wherein said optical amplifier is a semiconductor laser amplifier.

20. A wavelength tunable light source equipment as set forth in claim 18, wherein said optical amplifier is an optical fiber amplifier.

21. A wavelength tunable light source equipment as set forth in claim 18, wherein part of the output light is detected by a photometer and photodetector and an optical amplification rate of said optical amplifier is adjusted in accordance with a detection signal of the same to maintain said light output constant.

22. A wavelength tunable light source equipment as set forth in claim 7, wherein part of the output light is detected by a photometer and photodetector and an angle of said Faraday rotator is adjusted in accordance with a detection signal of the same to maintain said light output constant.

* * * * *